United States Patent
Yu et al.

(10) Patent No.: US 9,490,283 B2
(45) Date of Patent: *Nov. 8, 2016

(54) ACTIVE PIXEL SENSOR WITH NANOWIRE STRUCTURED PHOTODETECTORS

(71) Applicant: ZENA TECHNOLOGIES, INC., Cambridge, MA (US)

(72) Inventors: Young-June Yu, Cranbury, NJ (US); Munib Wober, Topsfield, MA (US)

(73) Assignee: ZENA TECHNOLOGIES, INC., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/293,164

(22) Filed: Jun. 2, 2014

(65) Prior Publication Data

US 2014/0361356 A1    Dec. 11, 2014

Related U.S. Application Data

(63) Continuation of application No. 13/543,556, filed on Jul. 6, 2012, now Pat. No. 8,766,272, and a continuation of application No. 12/633,305, filed on Dec. 8, 2009, now Pat. No. 8,299,472.

(51) Int. Cl.
*H01L 29/15* (2006.01)
*H01L 27/146* (2006.01)
(Continued)

(52) U.S. Cl.
CPC ..... *H01L 27/14612* (2013.01); *H01L 27/1461* (2013.01); *H01L 27/14625* (2013.01);
(Continued)

(58) Field of Classification Search
CPC .............. H01L 27/14612; H01L 31/035227; H01L 31/1126; H01L 31/02327
USPC .................................................. 257/438–440
See application file for complete search history.

(56) References Cited

U.S. PATENT DOCUMENTS 1,918,848 A   7/1933   Land
3,903,427 A   9/1975   Pack
(Continued)

FOREIGN PATENT DOCUMENTS

CN    1624925    6/2005
CN    1306619    3/2007
(Continued)

OTHER PUBLICATIONS

CMOS image sensor pixel microlens array optimization using FDTD Solutions, http://www.lumerical_com/fdtd_microlens/cmos_image_sensor_pixel_microlens.php, pp. 1-2, Jun. 25, 2008.
(Continued)

*Primary Examiner* — Thanh T Nguyen
(74) *Attorney, Agent, or Firm* — Pillsbury Winthrop Shaw Pittman LLP

(57) ABSTRACT

An imaging device formed as an active pixel array combining a CMOS fabrication process and a nanowire fabrication process. The pixels in the array may include a single or multiple photogates surrounding the nanowire. The photogates control the potential profile in the nanowire, allowing accumulation of photo-generated charges in the nanowire and transfer of the charges for signal readout. Each pixel may include a readout circuit which may include a reset transistor, charge transfer switch transistor, source follower amplifier, and pixel select transistor. A nanowire is generally structured as a vertical rod on the bulk semiconductor substrate to receive light energy impinging onto the tip of the nanowire. The nanowire may be configured to function as either a photodetector or a waveguide configured to guild the light to the substrate. Light of different wavelengths can be detected using the imaging device.

27 Claims, 11 Drawing Sheets

A pixel with a nanowire structured photodetector (Front side illumination)

(51) Int. Cl.
*H01L 31/0232* (2014.01)
*H01L 31/0352* (2006.01)
*H01L 31/101* (2006.01)
*H01L 31/102* (2006.01)
*H01L 31/112* (2006.01)

(52) U.S. Cl.
CPC ..... *H01L27/14645* (2013.01); *H01L 31/0232* (2013.01); *H01L 31/02327* (2013.01); *H01L 31/0352* (2013.01); *H01L 31/03529* (2013.01); *H01L 31/035227* (2013.01); *H01L 31/101* (2013.01); *H01L 31/102* (2013.01); *H01L 31/1126* (2013.01); *H01L 27/14643* (2013.01); *Y02E 10/50* (2013.01)

(56) References Cited

U.S. PATENT DOCUMENTS

| | | |
|---|---|---|
| 4,017,332 A | 4/1977 | James |
| 4,292,512 A | 9/1981 | Miller |
| 4,316,048 A | 2/1982 | Woodall |
| 4,357,415 A | 11/1982 | Hartman |
| 4,387,265 A | 6/1983 | Dalal |
| 4,394,571 A | 7/1983 | Jurisson |
| 4,400,221 A | 8/1983 | Rahilly |
| 4,443,890 A | 4/1984 | Eumurian |
| 4,513,168 A | 4/1985 | Borden |
| 4,531,055 A | 7/1985 | Shepherd, Jr. |
| 4,620,237 A | 10/1986 | Traino |
| 4,678,772 A | 7/1987 | Segal |
| 4,827,335 A | 5/1989 | Saito |
| 4,846,556 A | 7/1989 | Haneda |
| 4,857,973 A | 8/1989 | Yang |
| 4,876,586 A | 10/1989 | Dyck |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 4,990,988 A | 2/1991 | Lin |
| 5,071,490 A | 12/1991 | Yokota |
| 5,081,049 A | 1/1992 | Green |
| 5,096,520 A | 3/1992 | Faris |
| 5,124,543 A | 6/1992 | Kawashima |
| 5,217,911 A | 6/1993 | Denda |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,391,896 A | 2/1995 | Wanlass |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Uenlue |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang |
| 5,943,463 A | 8/1999 | Unuma |
| 5,968,528 A | 10/1999 | Deckner |
| 6,013,871 A | 1/2000 | Curtin |
| 6,033,582 A | 3/2000 | Lee |
| 6,037,243 A | 3/2000 | Ha |
| 6,046,466 A | 4/2000 | Ishida |
| 6,074,892 A | 6/2000 | Bowers |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto |
| 6,463,204 B1 | 10/2002 | Ati |
| 6,542,231 B1 | 4/2003 | Garrett |
| 6,563,995 B2 | 5/2003 | Keaton |
| 6,566,723 B1 | 5/2003 | Vook |
| 6,680,216 B2 | 1/2004 | Kwasnick |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,109,517 B2 | 9/2006 | Zaidi |
| 7,153,720 B2 | 12/2006 | Augusto |
| 7,163,659 B2 | 1/2007 | Stasiak |
| 7,192,533 B2 | 3/2007 | Bakkers |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,253,017 B1 | 8/2007 | Roscheisen |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang |
| 7,306,963 B2 | 12/2007 | Linden |
| 7,307,327 B2 | 12/2007 | Bahl |
| 7,311,889 B2 | 12/2007 | Awano |
| 7,326,915 B2 | 2/2008 | Kaluzhny |
| 7,330,404 B2 | 2/2008 | Peng |
| 7,335,962 B2 | 2/2008 | Mouli |
| 7,336,860 B2 | 2/2008 | Cyr |
| 7,339,110 B1 | 3/2008 | Mulligan et al. |
| 7,358,583 B2 | 4/2008 | Reznik |
| 7,381,966 B2 | 6/2008 | Starikov |
| 7,388,147 B2 | 6/2008 | Mulligan |
| 7,416,911 B2 | 8/2008 | Heath |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang |
| 7,524,694 B2 | 4/2009 | Adkisson |
| 7,582,587 B2 | 9/2009 | Gruev |
| 7,582,857 B2 | 9/2009 | Gruev |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa |
| 7,655,860 B2 | 2/2010 | Parsons |
| 7,663,202 B2 | 2/2010 | Wang |
| 7,692,860 B2 | 4/2010 | Sato |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |

(56) References Cited

U.S. PATENT DOCUMENTS

| | | |
|---|---|---|
| 7,732,839 B2 | 6/2010 | Sebe |
| 7,736,954 B2 | 6/2010 | Hussain |
| 7,740,824 B2 | 6/2010 | Godfried |
| 7,790,495 B2 | 9/2010 | Assefa |
| 7,872,324 B2 | 1/2011 | Kim |
| 7,888,155 B2 | 2/2011 | Chen |
| 7,902,540 B2 | 3/2011 | Cohen |
| 8,030,729 B2 | 10/2011 | Quitoriano |
| 8,035,184 B1 | 10/2011 | Dutta |
| 8,049,203 B2 | 11/2011 | Samuelson |
| 8,063,450 B2 | 11/2011 | Wernersson |
| 8,067,299 B2 | 11/2011 | Samuelson |
| 8,067,736 B2 | 11/2011 | Gruss |
| 8,084,728 B2 | 12/2011 | Tsang |
| 8,093,675 B2 | 1/2012 | Tsunemi |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjorek |
| 8,208,776 B2 | 6/2012 | Tokushima |
| 8,212,136 B2 | 7/2012 | Landis |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 * | 10/2012 | Yu et al. .................. 257/72 |
| 8,330,090 B2 | 12/2012 | Agarwal |
| 8,384,007 B2 | 2/2013 | Yu |
| 8,455,857 B2 | 6/2013 | Samuelson |
| 8,514,411 B2 | 8/2013 | Wober |
| 8,546,742 B2 | 10/2013 | Wober |
| 8,748,799 B2 | 6/2014 | Wober |
| 8,766,272 B2 * | 7/2014 | Yu et al. .................. 257/72 |
| 8,791,470 B2 | 7/2014 | Wober |
| 8,810,808 B2 | 8/2014 | Wober |
| 8,835,831 B2 | 9/2014 | Yu et al. |
| 8,866,065 B2 | 10/2014 | Wober |
| 9,000,353 B2 | 4/2015 | Seo |
| 2002/0003201 A1 | 1/2002 | Yu |
| 2002/0020846 A1 | 2/2002 | Pi |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1 | 8/2003 | Vispute |
| 2003/0189202 A1 | 10/2003 | Li |
| 2003/0227090 A1 | 12/2003 | Okabe |
| 2004/0011975 A1 | 1/2004 | Nicoli et al. |
| 2004/0021062 A1 | 2/2004 | Zaidi |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea |
| 2004/0109666 A1 | 6/2004 | Kim |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton |
| 2004/0160522 A1 | 8/2004 | Fossum |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0261840 A1 | 12/2004 | Schmit |
| 2005/0009224 A1 | 1/2005 | Yang |
| 2005/0035381 A1 | 2/2005 | Holm |
| 2005/0082676 A1 | 4/2005 | Andry |
| 2005/0087601 A1 | 4/2005 | Gerst |
| 2005/0095699 A1 | 5/2005 | Miyauchi |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1 | 11/2005 | Yang |
| 2005/0284517 A1 | 12/2005 | Shinohara |
| 2006/0011362 A1 | 1/2006 | Tao |
| 2006/0027071 A1 | 2/2006 | Barnett |
| 2006/0038990 A1 | 2/2006 | Habib |
| 2006/0113622 A1 | 6/2006 | Adkisson |
| 2006/0121371 A1 | 6/2006 | Wu |
| 2006/0146323 A1 | 7/2006 | Bratkovski |
| 2006/0162766 A1 | 7/2006 | Gee |
| 2006/0180197 A1 | 8/2006 | Gui |
| 2006/0208320 A1 | 9/2006 | Tsuchiya et al. |
| 2006/0257071 A1 | 11/2006 | Bise |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx |
| 2007/0126037 A1 | 6/2007 | Ikeda |
| 2007/0137697 A1 * | 6/2007 | Kempa et al. .................. 136/256 |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0172970 A1 | 7/2007 | Uya |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |

(56) References Cited

U.S. PATENT DOCUMENTS

| | | |
|---|---|---|
| 2008/0006319 A1 | 1/2008 | Bettge |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar |
| 2008/0055451 A1 | 3/2008 | Kanbe |
| 2008/0065451 A1 | 3/2008 | For |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0137188 A1 | 6/2008 | Sato et al. |
| 2008/0143906 A1 | 6/2008 | Allemand et al. |
| 2008/0145965 A1 | 6/2008 | Reznik |
| 2008/0149914 A1 | 6/2008 | Samuelson |
| 2008/0149944 A1 | 6/2008 | Samuelson |
| 2008/0157253 A1 | 7/2008 | Starikov |
| 2008/0166883 A1 | 7/2008 | Liu |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim |
| 2008/0283728 A1 | 11/2008 | Inoue |
| 2008/0283883 A1* | 11/2008 | Shim ................... 257/292 |
| 2008/0297281 A1 | 12/2008 | Ayazi |
| 2008/0311693 A1 | 12/2008 | Maxwell |
| 2008/0311712 A1 | 12/2008 | Anwar |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0052029 A1 | 2/2009 | Dai et al. |
| 2009/0057650 A1 | 3/2009 | Lieber |
| 2009/0072145 A1 | 3/2009 | Peczalski |
| 2009/0104160 A1 | 4/2009 | Young |
| 2009/0120498 A1 | 5/2009 | Yamazaki |
| 2009/0121136 A1 | 5/2009 | Gruss |
| 2009/0127442 A1 | 5/2009 | Lee |
| 2009/0146198 A1 | 6/2009 | Joe |
| 2009/0151782 A1 | 6/2009 | Ko |
| 2009/0152664 A1* | 6/2009 | Klem et al. ................ 257/440 |
| 2009/0153961 A1 | 6/2009 | Murakami |
| 2009/0165844 A1 | 7/2009 | Dutta |
| 2009/0173976 A1 | 7/2009 | Augusto |
| 2009/0179225 A1 | 7/2009 | Fertig |
| 2009/0179289 A1 | 7/2009 | Park |
| 2009/0188552 A1 | 7/2009 | Wang |
| 2009/0189144 A1* | 7/2009 | Quitoriano et al. ........... 257/12 |
| 2009/0189145 A1 | 7/2009 | Wang |
| 2009/0194160 A1 | 8/2009 | Chin |
| 2009/0199597 A1 | 8/2009 | Danley |
| 2009/0201400 A1 | 8/2009 | Zhang |
| 2009/0206405 A1 | 8/2009 | Doyle |
| 2009/0211622 A1 | 8/2009 | Frolov |
| 2009/0223558 A1 | 9/2009 | Sun |
| 2009/0224245 A1 | 9/2009 | Umezaki |
| 2009/0224349 A1 | 9/2009 | Gambino |
| 2009/0230039 A1 | 9/2009 | Hoenig |
| 2009/0233445 A1 | 9/2009 | Lee |
| 2009/0242018 A1 | 10/2009 | Ahn |
| 2009/0243016 A1 | 10/2009 | Kawahara |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu |
| 2009/0266974 A1 | 10/2009 | Verhulst |
| 2009/0272423 A1 | 11/2009 | Niira |
| 2009/0278998 A1 | 11/2009 | El-Ghoroury |
| 2009/0289320 A1 | 11/2009 | Cohen |
| 2009/0305454 A1 | 12/2009 | Cohen |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0025710 A1 | 2/2010 | Yamada |
| 2010/0072577 A1 | 3/2010 | Nuzzo et al. |
| 2010/0078055 A1 | 4/2010 | Vidu |
| 2010/0078056 A1 | 4/2010 | Hovel |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0221866 A1 | 9/2010 | Graham et al. |
| 2010/0229939 A1 | 9/2010 | Shen |
| 2010/0230653 A1 | 9/2010 | Chen |
| 2010/0237454 A1 | 9/2010 | Fujisawa |
| 2010/0240104 A1 | 9/2010 | Zhang et al. |
| 2010/0244108 A1 | 9/2010 | Kohnke |
| 2010/0244169 A1 | 9/2010 | Maeda |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang |
| 2010/0302440 A1 | 12/2010 | Wober |
| 2010/0304061 A1 | 12/2010 | Ye |
| 2010/0308214 A1 | 12/2010 | Wober |
| 2010/0313952 A1 | 12/2010 | Coakley |
| 2010/0319763 A1 | 12/2010 | Park |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su |
| 2011/0049572 A1 | 3/2011 | Jeon et al. |
| 2011/0050042 A1 | 3/2011 | Choi |
| 2011/0057231 A1 | 3/2011 | Jeon et al. |
| 2011/0057234 A1 | 3/2011 | Jeon et al. |

(56) References Cited

U.S. PATENT DOCUMENTS

| | | |
|---|---|---|
| 2011/0057286 A1 | 3/2011 | Jeon et al. |
| 2011/0080508 A1 | 4/2011 | Katsuno |
| 2011/0084212 A1 | 4/2011 | Clark |
| 2011/0127490 A1 | 6/2011 | Mi |
| 2011/0133060 A1 | 6/2011 | Yu |
| 2011/0133160 A1 | 6/2011 | Yu |
| 2011/0135814 A1 | 6/2011 | Miyauchi |
| 2011/0139176 A1 | 6/2011 | Cheung |
| 2011/0146771 A1 | 6/2011 | Chuang |
| 2011/0147870 A1 | 6/2011 | Ang |
| 2011/0180894 A1* | 7/2011 | Samuelson et al. ......... 257/438 |
| 2011/0195577 A1 | 8/2011 | Kushibiki |
| 2011/0220191 A1 | 9/2011 | Flood |
| 2011/0226937 A1 | 9/2011 | Yu |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang |
| 2011/0272014 A1 | 11/2011 | Mathai |
| 2011/0297214 A1 | 12/2011 | Kim |
| 2011/0309237 A1 | 12/2011 | Seo et al. |
| 2011/0309240 A1 | 12/2011 | Yu et al. |
| 2011/0309331 A1 | 12/2011 | Yu |
| 2011/0315988 A1 | 12/2011 | Yu |
| 2011/0316106 A1 | 12/2011 | Kim |
| 2012/0006390 A1 | 1/2012 | Huo et al. |
| 2012/0009714 A1 | 1/2012 | Mouli |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0153124 A1 | 6/2012 | Yu |
| 2012/0192939 A1 | 8/2012 | Tamboli et al. |
| 2012/0196401 A1 | 8/2012 | Graham |
| 2012/0240999 A1 | 9/2012 | Yoshida |
| 2012/0258563 A1 | 10/2012 | Ogino |
| 2012/0280345 A1 | 11/2012 | Zhu |
| 2012/0298843 A1 | 11/2012 | Yu |
| 2012/0313073 A1 | 12/2012 | McKone et al. |
| 2012/0313078 A1 | 12/2012 | Fukui |
| 2012/0318336 A1 | 12/2012 | Hekmatshoar-Tabari et al. |
| 2012/0322164 A1 | 12/2012 | Lal |
| 2013/0000704 A1 | 1/2013 | Fogel |
| 2013/0037100 A1 | 2/2013 | Platzer Bjorkman et al. |
| 2013/0112256 A1 | 5/2013 | Yu |
| 2013/0125965 A1 | 5/2013 | Hazeghi et al. |
| 2013/0174896 A1 | 7/2013 | Ardo et al. |
| 2013/0174904 A1 | 7/2013 | Yamasaki |
| 2013/0220406 A1 | 8/2013 | Day |
| 2013/0341749 A1 | 12/2013 | Yu et al. |
| 2014/0096816 A1 | 4/2014 | Atwater et al. |
| 2014/0117401 A1 | 5/2014 | Herner |
| 2015/0171272 A1 | 6/2015 | Luo |

FOREIGN PATENT DOCUMENTS

| | | |
|---|---|---|
| CN | 100350429 | 11/2007 |
| CN | 101221993 | 7/2008 |
| CN | 101459185 | 6/2009 |
| CN | 100568516 | 12/2009 |
| CN | 101675522 | 3/2010 |
| CN | 101681941 | 3/2010 |
| CN | 103201858 | 7/2013 |
| EP | 1367819 | 12/2003 |
| EP | 0809303 B1 | 9/2006 |
| FR | 2923651 | 5/2009 |
| GB | 2348399 A | 4/2000 |
| JP | 359013708 A | 1/1984 |
| JP | 59198413708 | 1/1984 |
| JP | 2000324396 | 11/2000 |
| JP | 2002151715 A | 5/2002 |
| JP | 2005252210 A | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2012543250 | 4/2013 |
| JP | 2013513253 | 4/2013 |
| JP | 2013513254 | 4/2013 |
| TW | I318418 | 5/2004 |
| TW | 1228782 | 3/2005 |
| TW | 200535914 | 11/2005 |
| TW | 200536048 | 11/2005 |
| TW | 200742115 | 4/2007 |
| TW | 200810100 | 2/2008 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | I320235 | 2/2010 |
| TW | 201027730 | 7/2010 |
| TW | 201034172 | 9/2010 |
| TW | 201044610 | 12/2010 |
| TW | 201140859 | 11/2011 |
| WO | 8603347 A1 | 6/1986 |
| WO | 0002379 | 1/2000 |
| WO | 02069623 | 9/2002 |
| WO | 03107439 | 12/2003 |
| WO | 03107439 A1 | 12/2003 |
| WO | 2005064337 | 7/2005 |
| WO | 2007000879 | 1/2007 |
| WO | 2008069565 | 6/2008 |
| WO | 2008079076 | 7/2008 |
| WO | 2008079076 A1 | 7/2008 |
| WO | 2008131313 A2 | 10/2008 |
| WO | 2008135905 | 11/2008 |
| WO | 2008135905 A2 | 11/2008 |
| WO | 2008135905 A3 | 11/2008 |
| WO | 2008143727 A2 | 11/2008 |
| WO | 2008131313 | 12/2008 |
| WO | 2009099841 | 8/2009 |
| WO | 2009116018 A2 | 9/2009 |
| WO | 2009137241 A2 | 11/2009 |
| WO | 2010014099 | 2/2010 |
| WO | 2010019887 A1 | 2/2010 |
| WO | 2010039631 A1 | 4/2010 |
| WO | 2010067958 | 8/2010 |
| WO | 2011074457 | 6/2011 |

OTHER PUBLICATIONS

Adler, Nanowire Lawns Make for Sheets of Image Sensors, NewScientist.com, Jul. 28, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL: http://otd.harvard.edu/technologies/tech.php?case=3702.

Baillie et al., 'Zero-space microlenses for CMOS image sensors: optical modeling and lithographic process development', Publication Date May 2004, http://adsabs.harvard.edu/abs/2004SPIE.5377..953B, pp. 1-2.

Baomin, et al., Nanotechology 23 (2012) 194003, 7 pages.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Canadian Office Action of Canadian Application No. 3,676,376, dated Oct. 11, 2013.

Catrysse, et al., An Integrated Color Pixel in 0.18pm CMOS Technology, Proceedings IEDM 2001, pp. 559-562.

(56) References Cited

OTHER PUBLICATIONS

Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Chung, Sung-Wook et al. Silicon Nanowire Devices. Applied Physics Letters, vol., 76, No. 15 (Apr. 10, 2000), pp. 2068-2070.
CMOS image sensor pixel optical efficiency and optical crosstalk optimization using FDTD Solutions' www.lumerical.com/fdtd_microlens/cmos_image_sensor_pixel_microlens.php, Mar. 19, 2009.
Deptuch et al., Vertically Integrated Circuits at Fermilab, IEEE Transactions on Nuclear Science, Aug. 2010, vol. 54, Issue 4, pp. 2178-2186.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, vol. 19, No. 25. 2008.
Furumiya, et al. 'High-sensitivity and no-crosstalk pixel technology for embedded CMOS image sensor'; IEEE Electron Device Letters, vol. 48, No. 10, Oct. 2001.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Geyer et al., Model for the Mass Transport during Metal-Assisted Chemical Etching with Contiguous Metal Films as Catalysts, J. Phys. Chem. C 2012, 116, 13446-13451.
Guillaumee, et al.; Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
Hopkins, Addressing sidewall roughness using dry etching silicon and Si02, Jul. 1, 2004, ElectroIQ, vol. 47, Issue 7.
Hsu, et al. 'Light Guide for Pixel Crosstalk Improvement in Deep Submicron Cmos Image Sensor'; IEEE Electron Device Letters, vol. 25, No. 1, Jan. 2004.
International Preliminary Report and Written Opinion re PCT/US2010/059468, mailed Jun. 21, 2012.
International Preliminary Report and Written Opinion re PCT/US2010/059491, mailed Jun. 21, 2012.
International Preliminary Report and Written Opinion re PCT/US2010/059496, mailed Jun. 21, 2012.
Office Action issued on Mar. 3, 2014 in Chinese Application No. 200980142671.9.
International Preliminary Report on Patentability for PCT International Application No. PCT/US2010/035722, mailed Nov. 3, 2011.
International Preliminary Report on Patentability for PCT International Patent Application No. PCT/U62009/055963, mailed Mar. 17, 2011.
International Preliminary Search Report on Patentability of PCT/US2011/057325, mailed May 2, 2013 (9 pages).
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Patent Application No. PCT/US2009/055963, mailed Oct. 15, 2009.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/057227, mailed Jan. 26, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
International Search Report and Written Opinion re PCT/US2011/57325, mailed Jun. 22, 2012.
Jeong, et al., Nano Lett. 2012, 12, 2971-2976.
Jeong et al., J. Vac. Sci. Technol. A 30(6), Nov./Dec. 2012.
Jin-Kon Kim; 'New Functional Nanomaterials Based on Block Copolymers' http://www.ziu.edu.cn/adver/subjectizyhd/jz0707061313.html, Jul. 11, 2007.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide as Dopant Source for Shallow Doping Silicon, Meeting Abstract 943, 217th ECS Meeting MP2010-O1 , Apr. 25-30, 2010 Vancouver Canada, El—Advanced Gate Stack, Source / Drain, and Channel Engineering for Si-Based CMOS 6: New Materials, Processes,and Equipment.
Kane, Why Nanowires Make Great Photodetectors, EurekAlert.com article, Apr. 25, 2007.

(56) References Cited

OTHER PUBLICATIONS

Kempa, Thomas J. et al. Single and Tandem Axial p-i-n Nanowire Photovoltaic Devices, Nano Letters, 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law et al., Semiconductor Nanowires and Nanotubes, Annu. Rev. Mater. Res., 2004, vol. 34, pp. 83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: http://spie.org/x40194.xml?ArticleID=x40194.
Loose et al., CMOS Detector technology, Scientific Technology, Scientific Detector Workshop, Sicily 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., Press, 2002, pp. 125-204. CRC.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Mei-Ling Kuo et al. "Realization of a near-perfect antireflection coating for silicon solar energy utilization" (Nov. 1, 2008, vol. 33, No. 21, Optics Letters).
Morales et al., A Laser Ablation Method for the Synthesis of Crystalline Semiconductor Nanowires, Science, Jan. 9, 1998, vol. 279, pp. 208-211.
Mukhopadhyay, When PDMS Isn't the Best, American Chemical Society, May 1, 2007.
N. L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php, dowwnloaded Jun. 4, 2009.
Rosfjord et al., Nanowire Single-Photon Detector with an Integrated Optical Cavity and Anti-Reflection Coating, Optics Express: The International Electronic Journal of Optics; Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, Seas Communications, Feb. 14, 2010, obtained at url:http://news.harvard.edu/gazette/story/2010/02/digging-deep-into-diamonds/.
Sarkar et al., Integrated polarization-analyzing CMOS image sensor for detecting incoming light ray direction, Sensors Application Symposium (SAS), Mar. 29, 2012, p. 194-199, 1010 IEEE.
Schmidt et al., Realization of a Silicon Nanowire Vertical Surround-Gate Field-Effect Transistor, Small, Jan. 2006, vol. 2, No. 1, pp. 85-88.
Seo, et. al., "Multicolored vertical silicon nanowires," Nano Letters, vol. 11 issue 4, pp. 1851-1856, 2010.
Shimizu et al., Homoepitaxial Growth of Vertical Si Nanowires on Si(100) Substrate using Anodic Aluminum Oxide Template, (abstract only), Materials Research Society, Fall 2007.
Shockley, et al., Detailed Balance Limit of Efficiency of p-n Junction Solar Cells, J. of Appl. Physics, vol. 32, No. 3, Mar. 1961, 10 pages.
Song et al., Vertically Standing Ge Nanowires on GaAs(110) Substrates, Nanotechnology 19, Feb. 21, 2008.
Taiwanese Office Action of Taiwan Patent Application No. 099116881, issued Jul. 18, 2013 (8 pages).
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. Crosstalk improvement technology applicable to 0.14m CMOS image sensor; IEEE International Electron Devices Meeting, Dec. 13-15, 2004; IEDM Technical Digest, pp. 997-1000.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
U.S. Office Action for U.S. Appl. No. 12/573,582, dated Jun. 28, 2012.
U.S. Office Action for U.S. Appl. No. 12/633,313, dated Aug. 1, 2013, 20 pages.
U.S. Office Action for U.S. Appl. No. 12/966,514, dated Aug. 15, 2013, 17 pages.
U.S. Office Action for U.S. Appl. No. 12/966,535, mailed Jun., 14, 2013, 22 pages.
U.S. Office Action for U.S. Appl. No. 12/966,573, dated Aug. 6, 2013, 13 pages.
U.S. Office Action for U.S. Appl. No. 13/048,635, mailed Jun., 6, 2013, 24 pages.
U.S. Office Action for U.S. Appl. No. 13/494,661, notification date Nov. 7, 2012.
Verheijen, Marcel A. et al. Growth Kinetics of Heterostructured GaP-GaAs Nanowires. J. Am, Chem. Soc. 2006, 128, 1353-1359.
Wagner et al., Vapor-Liquid-Solid Mechanism of Single Crystal Growth, Applied Physics Letters, Mar. 1, 1964, vol. 4, No. 5, pp. 89-90.
Wang, Introduction to Nanotechnology—Where Opportunities arise & Great Future Being Built from Small Things, Fall 2008.
Wong et al., Lateral Nanoconcentrator Nanowire Multijunction Photovoltaic Cells, GCEP Progress report, Apr. 20, 2009, pp. 1-18.
Ye et al., Fabrication Techniques of High Aspect Ratio Vertical Lightpipes Using a Dielectric Photo Mask, SPIE, Proceedings, Feb. 2010, vol. 7591.
Zhang et al., Ultrahigh Responsivity Visible and Infrared Detection Using Silicon Nanowire Phototransistors, Nanoletters, May 14, 2010, vol. 10, No. 6, pp. 2117-2120.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 12/966,514, mailed Feb. 25, 2014.

(56) References Cited

OTHER PUBLICATIONS

U.S. Office Action for U.S. Appl. No. 14/021,672 mailed May 9, 2014.
U.S. Office Action for U.S. Appl. No. 12/945,492 mailed May 13, 2014.
Kosonocky, et al., 160×244 Element PtSi Schottky-Barrier IR-CCD Image Sensor, IEEE Transactions on Electron Devices, vol. Ed-32, No. 8, Aug. 1985.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
Office Action for U.S. Appl. No. 12/633,313 mailed Aug. 1,2014.
Office Action issued on Jun. 19, 2014 in Taiwanese Application No. 099133891.
U.S. Office Action for U.S. Appl. No. 12/982,269 mailed Jun. 11, 2014.
U.S. Office Action for U.S. Appl. No. 13/106,851 mailed May 29, 2014.
U.S. Office Action for U.S. Appl. No. 13/556,041 mailed Jun. 12, 2014.
Office Action for U.S. Appl. No. 13/693,207 mailed May 7, 2015.
Kim, Y.S. et al., "ITO/AU/ITO multilayer thin films for transparent conducting electrode applications", Applied Surface Science, vol. 254 (2007), pp. 1524-1527.
Philipp, H.R. et al., "Optical Constants of Silicon in the Region 1 to 10 ev", Physical Review, vol. 120, No. 1, pp. 37-38.
Office Action for U.S. Appl. No. 13/543,307 mailed Apr. 17, 2015.
Office Action issued Mar. 19, 2015 in Chinese Application No. 201180065814.8.
Office Action for U.S. Appl. No. 13/288,131 mailed Apr. 17, 2015.
Office Action issued on Mar. 18, 2015 in Chinese Application No. 201180066970.6.
Office Action issued Apr. 3, 2015 in Chinese Application No. 201180051048.X.
Office Action issued May 15, 2015 in U.S. Appl. No. 14/274,448.
Office Action for U.S. Appl. No. 12/982,269 mailed May 22, 2015.
Office Action for U.S. Appl. No. 14/281,108 mailed Apr. 6, 2015.
Office Action issued Feb. 23, 2015 in U.S. Appl. No. 13/925,429.
Notice of Allowance issued Jan. 30, 2015 in U.S. Appl. No. 14/487,375.
International Search Report and Written Opinion for International Application No. PCT/US2014/050544 mailed Jan. 9, 2015.
Office Action for U.S. Appl. No. 12/982,269, mailed Jan. 15, 2015.
Office Action for U.S. Appl. No. 12/945,492 mailed Jan. 16, 2015.
Office Action for U.S. Appl. No. 13/963,847 mailed Mar. 12, 2015.
Office Action for U.S. Appl. No. 12/966,514 mailed Mar. 10, 2015.
Office Action issued on Jan. 16, 2015 in Chinese Application No. 201180054442.9.
Office Action issued on Mar. 4, 2015 in U.S. Appl. No. 13/556,041.
Office Action for U.S. Appl. No. 14/450,812 mailed Apr. 1, 2015.
Office Action for U.S. Appl. No. 12/633,313 mailed Apr. 9, 2015.
Bernstein et al. "Modern Physics", Chapter 14, Section 6, pp. 420-421, 2000 by Prentice-Hall Inc.
U.S. Office Action for U.S. Appl. No. 12/966,514 mailed Sep. 23, 2014.
Berstein et al., "Modern Physics", Chapter 14, Section 6, pp. 420-421, 2000, Prentice-Hall, Inc.
University of California San Diego, Class ECE 183 Lab 1, 2013.
U.S. Office Action for U.S. Appl. No. 13/693,207 mailed Oct. 9, 2014.
Office Action issued on Jun. 24, 2014 in Taiwanese Application No. 098129911.
U.S. Office Action for U.S. Appl. No. 13/543,307 mailed Dec. 24, 2014.
U.S. Office Action for U.S. Appl. No. 14/274,448 mailed Dec. 5, 2014.

International Search Report and Written Opinion for International Application No. PCT/US2014/056558 mailed Dec. 12, 2014.
Office Action issued on Nov. 11, 2014 in Taiwanese Application No. 098129911.
Notice of Allowance issued on Dec. 1, 2014 in U.S. Appl. No. 12/910,664.
Office Action issued Aug. 12, 2015 in Chinese Application No. 201180054442.9.
Office Action mailed Sep. 30, 2015 in Japanese Application No. 2014-094365.
Office Action issued Jul. 9, 2015 in Taiwanese Application No. 102124069.
A. Gu et al., "Design and growth of III—V nanowire solar cell arrays on low cost substrates," Conf. Record, 35rd IEEE Photovoltaic Specialists Conference, Honolulu, Jun. 2010, pp. 20-25.
Office Action issued Jun. 23, 2015 in Chinese Application No. 201310284409.6.
Office Action for U.S. Appl. No. 14/450,812 mailed Jul. 23, 2015.
Office Action for U.S. Appl. No. 14/293,164 mailed Aug. 14, 2015.
Office Action dated Oct. 6, 2015 in Taiwanese Application No. 100141376.
Office Action dated Sep. 11, 2015 in Taiwanese Application No. 103143553.
International Search Report and Written Opinion mailed Nov. 27, 2015 in International Application No. PCT/US2015/038999.
Office Action for U.S. Appl. No. 12/966,514 mailed Nov. 2, 2015.
Office Action for U.S. Appl. No. 12/633,313 mailed Oct. 21, 2015.
Office Action for U.S. Appl. No. 13/963,847 mailed Sep. 1, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 14/450,812 mailed Oct. 28, 2015.
Office Action for U.S. Appl. No. 12/945,429 mailed Sep. 4, 2015.
Office Action issued on Nov. 25, 2015 in Japanese Application No. 2015-005091.
Office Action issued Nov. 17, 2015 in Taiwanese Application 103102171.
Office Action issued Nov. 20, 2015 in Taiwanese Application 104108370.
Office Action issued on Nov. 27, 2015 in Taiwanese Application No. 100138526.
International Search Report and Written Opinion mailed Jan. 8, 2016 in International Application No. PCT/US2015/055728.
Office Action issued Jan. 4, 2016 in U.S. Appl. No. 14/311,954.
Office Action issued Jan. 5, 2016 in U.S. Appl. No. 14/291,888.
Office Action issued Nov. 9, 2015 in U.S. Appl. No. 14/503,598.
Office Action issued Jan. 15, 2016 in U.S. Appl. No. 14/632,739.
Office Action issued Jan. 7, 2016 in U.S. Appl. No. 14/322,503.
Office Action issued Jan. 14, 2016 in U.S. Appl. No. 14/459,398.
Office Action issued Apr. 6, 2016 in Taiwanese Application 100149997.
Decision issued Mar. 28, 2016 in Taiwanese Application 103143553.
Office Action issued Apr. 27, 2016 in Chinese Application 201410265340.7.
Office Action issued Apr. 29, 2016 in Chinese Application 201301284409.6.
Office Action issued Feb. 4, 2016 in U.S. Appl. No. 14/274,448.
Office Action issued Mar. 7, 2016 in U.S. Appl. No. 14/450,812.
Office Action issued Feb. 25, 2016 in Chinese Application No. 201180051048.X.
Office Action issued Feb. 1, 2016 in Taiwanese Application 102124069.
Office Action issued Feb. 6, 2016 in Chinese Application No. 201180054442.9.
Office Action issued Apr. 21, 2016 in U.S. Appl. No. 14/322,503.
Office Action issued Apr. 14, 2016 in U.S. Appl. No. 14/704,143.
Office Action issued Apr. 27, 2016 in U.S. Appl. No. 14/291,888.
Office Action mailed Mar. 29, 2016 in Japanese Application No. 2014-138265.

(56) References Cited

OTHER PUBLICATIONS

International Preliminary Report on Patentability issued on Mar. 22, 2016 in International Application PCT/US2014/056558.
Decision issued on Jan. 30, 2016 in Taiwanese Application 099142971.
Office Action issued Dec. 28, 2015 in Taiwanese Application No. 102149110.
Office Action issued Dec. 25, 2015 in Chinese Application No. 201410264248.9.
Office Action issued Dec. 30, 2015 in Taiwanese Application No. 104123757.
International Search Report and Written Opinion mailed Nov. 27, 2015 in International Application PCT/US2015/038999.
Office Action issued Jan. 15, 2016 in Chinese Application No. 201180066970.6.
International Preliminary Report on Patentability issued Feb. 9, 2016 in International Application PCT/US2014/050544.
International Search Report and Written Opinion mailed Feb. 9, 2016 in International Application PCT/US2015/55710.
Office Action issued Jul. 6, 2016 in U.S. Appl. No. 14/334,848.
Office Action issued Jun. 3, 2016 in U.S. Appl. No. 14/459,398.
Office Action issued Jun. 1, 2016 in U.S. Appl. No. 13/693,207.
Notice of Allowance issued Jul. 25, 2016 in U.S. Appl. No. 12/945,492.
Office Action issued May 16, 2016 in U.S. Appl. No. 12/633,313.
Notice of Allowance mailed Aug. 30, 2016 in U.S. Appl. No. 14/291,888.
Office Action issued Aug. 22, 2016 in U.S. Appl. No. 14/450,812.
International Search Report and Written Opinion mailed Aug. 18, 2016 in International Application No. PCT/US2016/032774.
Office Action issued Jun. 29, 2016 in Chinese Application 201280030352.0.
Office Action issued Jun. 16, 2016 in Taiwanese Application 100138526.
Office Action issued Jun. 17, 2016 in Chinese Application 201410264248.9.

* cited by examiner

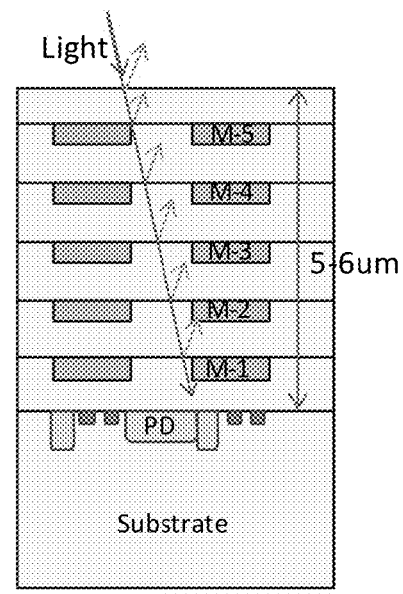
Fig. 1 Prior Art
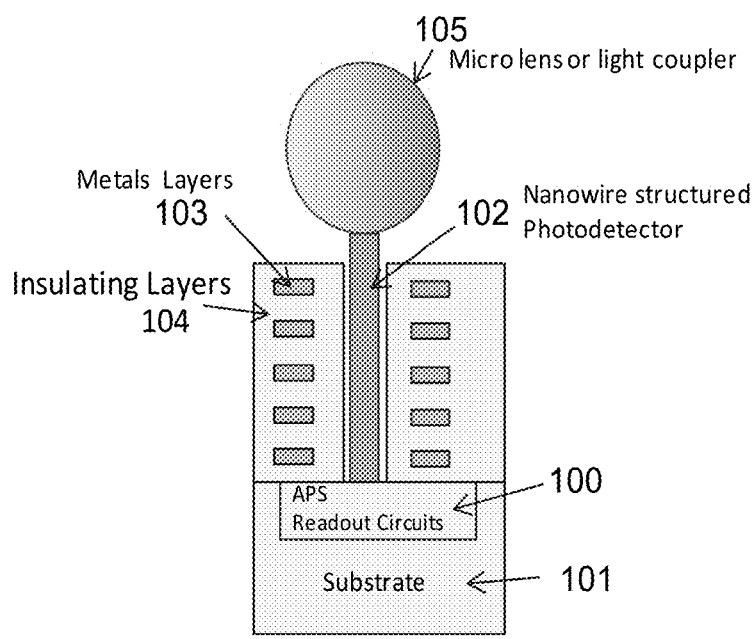
Fig. 2A, A pixel with a nanowire structured photodetector (Front side illumination)

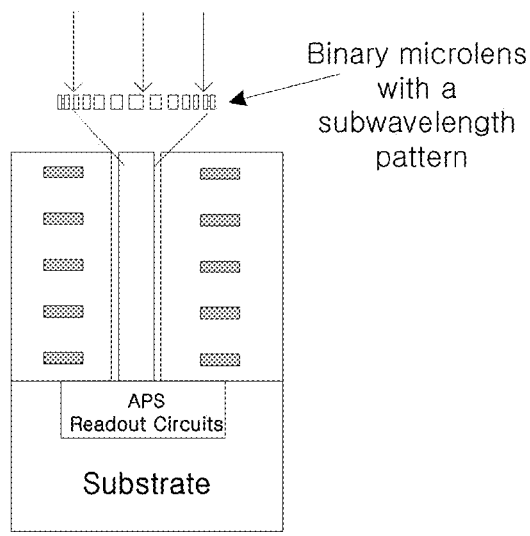
Fig. 2B, With a binary microlens on the NW structured photodetector
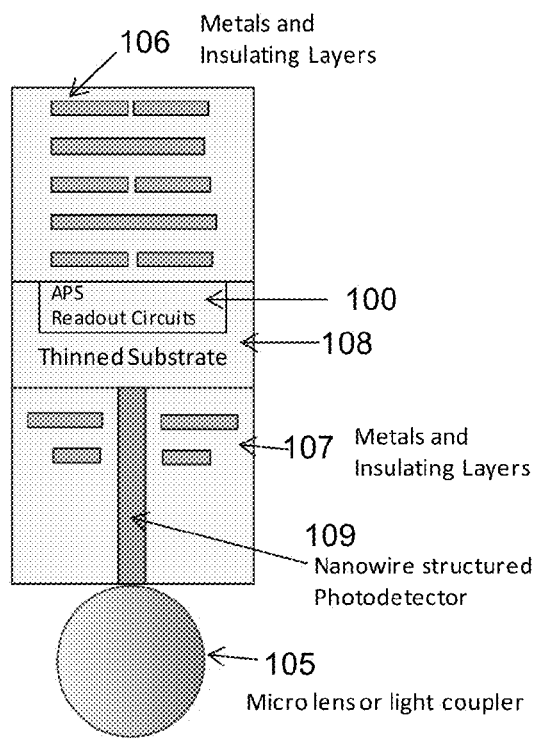
Fig. 3, A pixel with a nanowire structured photodetector (Backside illumination)

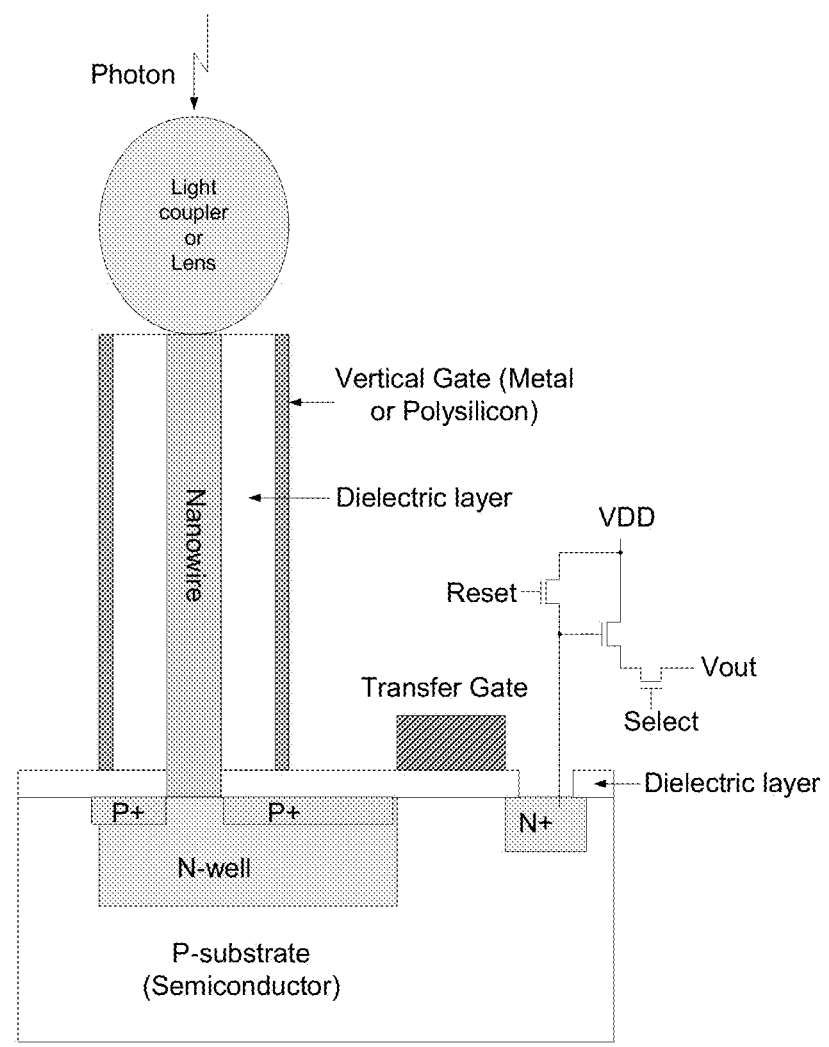
Fig. 4, A CMOS pixel with a nanowire and a VPG

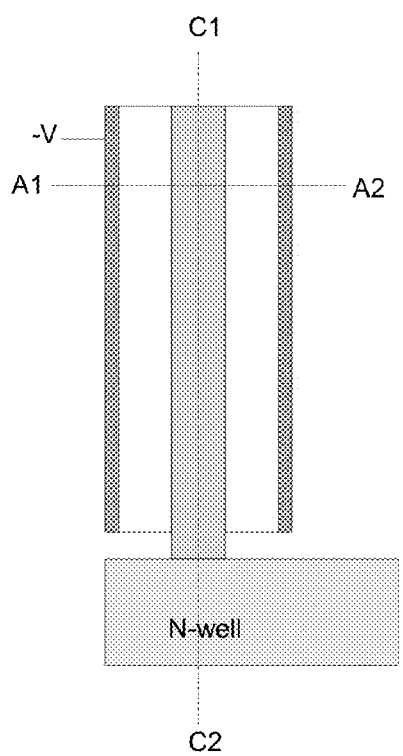
Fig. 5A, A CMOS pixel with a n-type nanowire and a VPG
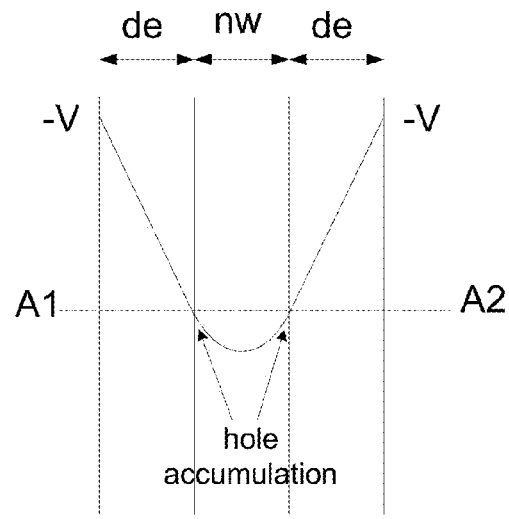
Fig. 5B, A potential profile along A1-A2
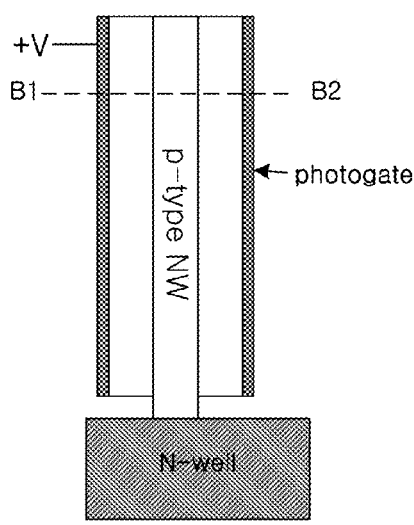
Fig. 5C, A CMOS pixel with a p-type nanowire and a VPG
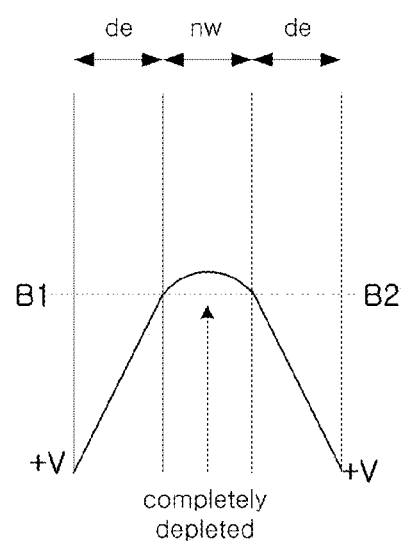
Fig. 5D, A potential profile along B1-B2

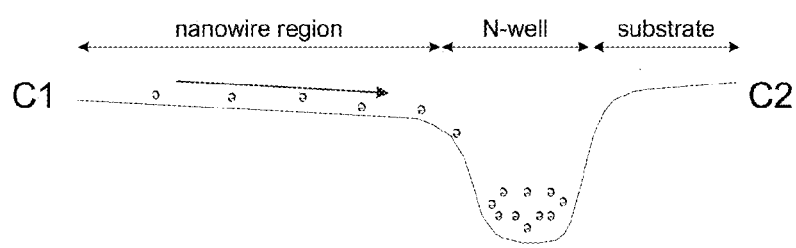
Fig. 6, A potential profile along C1-C2
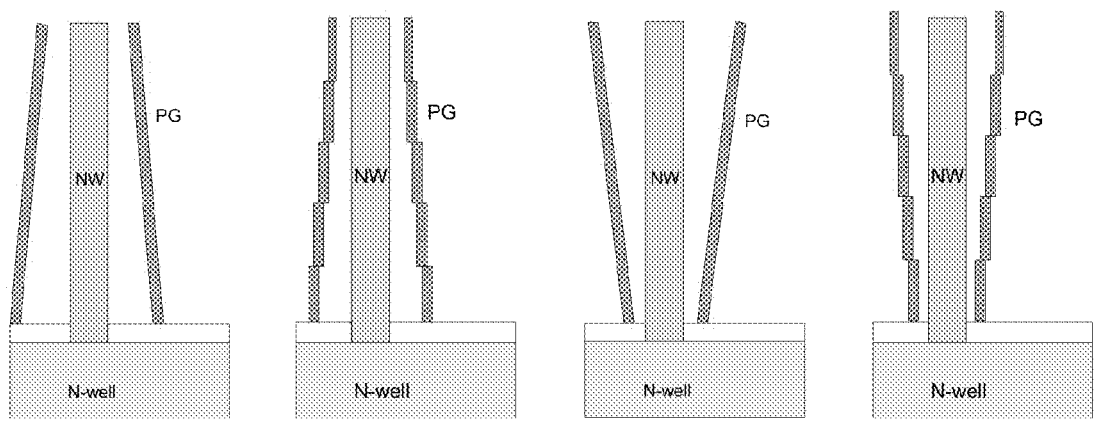
Fig. 7A     Fig. 7B     Fig. 7C     Fig. 7D Fig. 9, A Pixel Structure with a Front Side NW and Dual VPG

ACTIVE PIXEL SENSOR WITH NANOWIRE STRUCTURED PHOTODETECTORS

CROSS-REFERENCE TO RELATED APPLICATIONS

This application is a continuation of U.S. patent application Ser. No. 13/543,556, filed Jul. 6, 2012, which is a continuation of U.S. patent application Ser. No. 12/633,305, filed Dec. 8, 2009 (issued as U.S. Pat. No. 8,299,472). The disclosure of each of the prior application is considered part of and is incorporated by reference in the disclosure of this application. This application is related to U.S. application Ser. No. 12/621,497, filed Nov. 9, 2009, entitled "NANOWIRE CORE-SHELL LIGHT PIPES," which is incorporated herein in its entirety by reference.

FIELD OF THE INVENTION

The present invention relates generally to the field of semiconductor imaging devices which can be fabricated using standard CMOS processes plus a nanowire fabrication process.

BACKGROUND

Imaging devices implemented in complementary metal oxide semiconductor (CMOS) are well known and widely used together with CCD image sensors. CMOS imaging devices have a number of advantages: (1) they can reduce the cost and power consumption, (2) they are easy to manufacture, employing the highly standardized process developed for massive production of consumer integrated circuits (ICs) including memory chips and microprocessors and other digital and analog ICs, and (3) they integrate multiple functions on a single chip, allowing the scaling down of the size and power consumption of the device. They also allow for the adoption of smaller geometry processes provided by new advancements in the CMOS process.

Imaging devices are typically formed from rows and columns of pixels which include photo-detecting devices and supporting circuits. The photo-detecting devices typically include photodiodes, photoconductors, and photocapacitors, each of which may generate photo-charges in proportional to the photons impinging on the photodetectors. A CMOS pixel typically includes a photodiode, and three or four transistors that convert the photo-charges to voltage signal for the pixel output.

Typically, the one or more photodetectors in the pixel array receives only a fraction of light flux falling on the entire pixel area. This is because the pixel includes supporting circuitry that blocks the incoming light and typically does not function as a photodetector. The percentage of the photodetector area to the pixel area is often referred to as the optical fill factor. Typically, the fill factor of a small pixel is less than 30%. This means that less than 30% of the light energy received by the pixel is detected by the one or more photodetectors in the pixel.

A microlens system, which needs additional fabrication processing, is typically placed over every pixel in the pixel array to enhance the fill factor by focusing the light beam on the photodetector. This approach generally requires a gap of typically 0.7 µm between each microlenses due to fabrication requirements. For a small pixel on the order of 2 µm×2 µm, the microlens has a circular shape with an approximate diameter of 1.3 µm. In this case, a microlens is only able to cover about 33% of the pixel area. Consequently, enhancement of the fill factor by using a microlens is negligibly small for the small CMOS pixel case.

Furthermore, light needs to penetrate through multiple thick dielectric layers until it reaches down to the surface of the photodetector. (FIG. 1). At each interface between adjacent layers, some of the light is reflected due to the refractive index variations and the presence of an interface. Further, light energy is lost during transmission through the thick layers. This light transmission loss is proportional to the number of layers and the thickness of the layers. Further, multiple dielectric layers are formed due to CMOS fabrication requirements. Modern CMOS processes typically employ 5 to 6 metal layers for image sensor fabrication. This leads to depositions of 5 µm to 6 µm thick dielectric layers as each dielectric layer and metal layer is approximately 1.0 µm thick. Further, on top of the photodetector, where no metal layers are present, the dielectric layers are coated with a planarization layer for the planarization of the surface layer.

As a result, light energy loss due to transmission loss may become significant. In addition, when the pixel size is as small as 2.0 µm×2.0 µm or even smaller, the aspect ratio of the height to the size of the window opening of the metal layers above the photodetector is greater than 6. In this case, light beams can be blocked by the metal layers when light is incident at an angle other than perpendicular to the imaging plane. If a microlens is employed, the aspect ratio becomes even higher and results in a worse light shadow effect. This light shadowing becomes worsened as the pixel size becomes smaller. Consequently, the pixel signal is severely reduced, resulting in an unacceptable signal to noise ratio SNR.

Accordingly, there is a need to overcome these issues by introducing a new type of pixel architecture. Preferably, the new architecture should be CMOS compatible for ease of manufacture and electronics integration.

SUMMARY

In general, embodiments of the present invention combine active pixel circuits and nanowire photodetectors to form an active pixel sensor (APS) with a nanowire structured photodetector. An active element is any type of circuit component with the ability to electrically control electron and/or hole flow (electricity controlling electricity or light, or vice versa). Components incapable of controlling current by means of another electrical signal are called passive elements. Resistors, capacitors, inductors, transformers, and diodes are considered passive elements. Active elements include in embodiments disclosed herein, but are not limited to, an active waveguide, transistors, silicon-controlled rectifiers (SCRs), light emitting diodes, and photodiodes. A waveguide is a system or material designed to confine and direct electromagnetic radiation of selective wavelengths in a direction determined by its physical boundaries. Preferably, the selective wavelength is a function of the diameter of the waveguide. An active waveguide is a waveguide that has the ability to electrically control electron and/or hole flow (electricity controlling electricity or light, or vice versa). This ability of the active waveguide, for example, is one reason why the active waveguide could be considered to be "active" and within the genus of an active element.

According to an exemplary embodiment of the present invention, an imaging device is formed as a monolithic CMOS integrated circuit employing an industry standard CMOS process. This embodiment includes a focal plane having an array of pixels, each one of the pixels including an active pixel readout circuit. The active pixel readout circuit may include an amplifying field effect transistor (FET), a reset FET, an output switching FET, and a transfer gate, which is a switching FET for transferring charge from the photodetector to the input node of the amplifying FET. This embodiment typically comprises four FETs in a pixel, formed as a 4-T configuration. In other embodiments, the pixel readout circuits comprise a 3-T configuration by removing the transfer gate. In addition to the readout circuits, each pixel typically includes a photodetector formed as a very narrow and long cylinder shaped semiconductor rod, that is, a nanowire.

According to another embodiment, an additional transfer gate is formed operably connected to the nanowire structured photodetector so that photo-charges generated in the nanowire can be separated from the photo-charges generated in the bulk photodiode.

According to series of another embodiments, nanowire structured photodetectors are formed as photodiodes in many variations including: a p-doped nanowire, an n-doped nanowire, an axial p-n diode, an axial p-i-n diode, a coaxial p-n diode, a coaxial p-i-n diode, a p-doped nanowire at the back side of the substrate, and a p-doped nanowire with p+-doped outer shell at the back side of the substrate.

An embodiment relates to a device comprising a substrate, a nanowire photodetector located on the substrate, the nanowire photodiode comprising a nanowire having a surface and a core, wherein the axial direction of the nanowire is perpendicular to the substrate, and an active pixel readout circuit in the substrate. In one aspect, the nanowire photodetector comprises a photo conductor, a photodiode, or a photogate. In another aspect, the device, further comprises at least one vertical photogate surrounding the nanowire photodiode. In another aspect, the vertical photogate is configured to electrically passivate the surface of the nanowire, suppressing dark current. In another aspect, photo carrier lifetime is increase relative to a non-passivated nanowire photodiode.

In another aspect, the device has greater quantum efficiency relative to a non-passivated nanowire photodiode. In another aspect, the nanowire comprises an n-type semiconductor. In another aspect, a negative bias applied to the nanowire causes depletion of charge carriers in the nanowire. In another aspect, the nanowire comprises a p-type semiconductor. In another aspect, a positive bias applied to the nanowire causes depletion of charge carriers in the nanowire. In another aspect, the active pixel readout circuit comprises three transistors in a 3-T configuration. In another aspect, the active pixel readout circuit comprises four transistors in a 4-T configuration.

In another aspect, the device further comprises a microlens coupler operatively attached to the nanowire. In another aspect, the microlens coupler is a spherical ball lens or a binary microlens. In another aspect, an increase of the negative bias above a threshold inverts the surface of the nanowire. In another aspect, increase of the negative bias above a threshold depletes the surface and the core of the nanowire of mobile charges. In another aspect, the device further comprises a dielectric cladding layer between the photogate and the nanowire. In another aspect, the thickness of the dielectric cladding layer varies along the nanowire in the axial direction. In another aspect, the device 3, further comprises a substrate photodiode. In another aspect, the nanowire is located on a first side of the substrate and the substrate photodiode is located on a second side of the substrate. In another aspect, the nanowire and the substrate photodiode are located on the same side of the substrate.

An embodiment relates to a device comprising an array of pixels, the pixels comprising a substrate, a nanowire photodetector located on the substrate, the nanowire photodiode comprising a nanowire having a surface and a core, wherein the axial direction of the nanowire is perpendicular to the substrate and an active pixel readout circuit in the substrate. In one aspect, the device comprises a monolithic CMOS circuit.

DESCRIPTION OF THE FIGURES

Embodiments of the present disclosure will now be disclosed, by way of example only, with reference to the accompanying schematic drawings in which corresponding reference symbols indicate corresponding parts.

FIG. 1 illustrates a cross sectional view of a prior art small CMOS pixel.

FIG. 2A illustrates a simplified cross sectional view of an embodiment of a pixel with a nanowire structured photodetector with front side illumination.

FIG. 2B illustrates an aspect of the embodiment illustrated in FIG. 2A with a binary microlens on the NW structured photodetector.

FIG. 3 illustrates simplified cross section view of an embodiment of a pixel with a nanowire structured photodetector with backside illumination.

FIG. 4 illustrates an embodiment having a CMOS pixel with a nanowire and a vertical photogate (VPG).

FIG. 5A illustrates an embodiment having a CMOS pixel with a n-type nanowire and a VPG.

FIG. 5B, illustrates a potential profile of the embodiment of FIG. 5A along line A1-A2.

FIG. 5C illustrates an embodiment having a CMOS pixel with a p-type nanowire and a VPG.

FIG. 5D illustrates a potential profile of the embodiment of FIG. 5C along line B1-B2.

FIG. 6 illustrates a potential profile of the embodiment of FIG. 4 along line C1-C2.

FIG. 7A illustrates an embodiment having a negative photogate bias and a gradual variation in the thickness of the dielectric cladding layer.

FIG. 7B illustrates an embodiment having a negative photogate bias and a stepwise variation in the thickness of the dielectric cladding layer.

FIG. 7C illustrates an embodiment having a positive photogate bias and a gradual variation in the thickness of the dielectric cladding layer.

FIG. 7D illustrates an embodiment having a positive photogate bias and a stepwise variation in the thickness of the dielectric cladding layer.

DETAILED DESCRIPTION OF THE INVENTION

Figure 8:
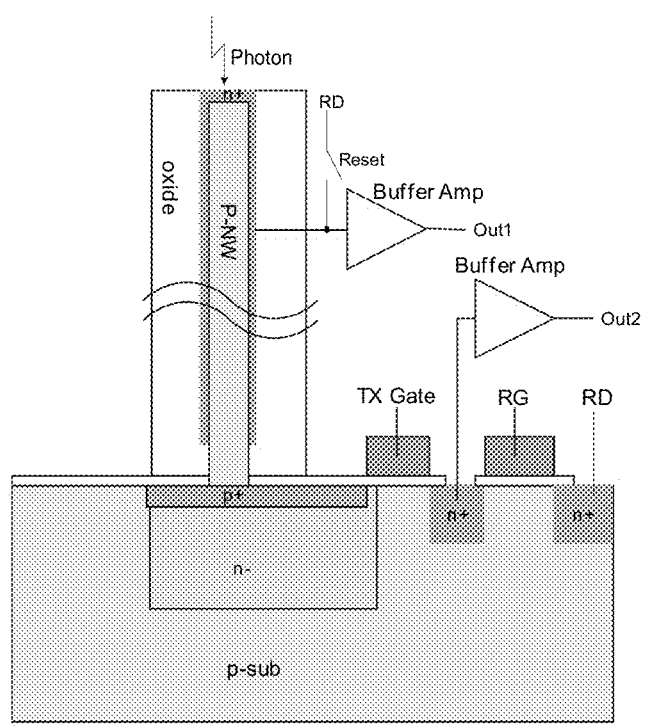
FIG. 8 illustrates a cross section view of an embodiment with a dual photodiode structure in which the p doped NW is coated with an n+ epitaxial layer to form a p-n junction.

In the following detailed description, reference is made to the accompanying drawings, which form a part thereof. In the drawings, similar symbols typically identify similar components, unless the context dictates otherwise. The illustrative embodiments described in the detail description, drawings, and claims are not meant to be limiting. Other embodiments may be utilized, and other changes may be made, without departing from the spirit or scope of the subject matter presented here.

Symbols for elements illustrated in the figures are summarized in the following table. The elements are described in more detail below.

TABLE 1

| Symbol | Element |
| --- | --- |
| VPG 1 (VP Gate 1) | The first vertical photogate |
| VPG 2 (VP Gate 1) | The second vertical photogate |
| TX Gate | Transfer gate |
| RG | Reset gate |
| RD | Reset drain |
| Sub | substrate |
| Out | Output |
| NW (nw) | Nanowire |
| PG | photogate |
| I (i) | Current |
| n+, n− | Semiconducting material with excess donors, n+ is heavily doped, n− is lightly doped |
| p+, p− | Semiconducting material with excess acceptors, p+ is heavily doped, p− is lightly doped |

The term nanowire refers to a structure that has a thickness or diameter of the order of several nanometers, for example, hundreds of nanometers or less and an unconstrained length. Nanowires could include metallic (e.g., Ni, Pt, Au), semiconducting (e.g., Si, InP, GaN, etc.), and insulating (e.g., $SiO_2$, $TiO_2$) materials. Nanowires could exhibit aspect ratios (length-to-width ratio) of 100 or more. As such they could be referred to as 1-dimensional materials. Nanowires could have many interesting properties that are not observed in bulk or 3-dimensional (3-D) materials. This is because electrons in nanowires could be quantum confined laterally and thus occupy energy levels that could be different from the traditional continuum of energy levels or bands found in bulk materials. As a result, nanowires could have discrete values of electrical and optical conductance.

The nanowire is upstanding (perpendicular to) and protruding from the substrate. The upstanding nanowire could be on the front side of the substrate or at the back side of the substrate. The substrate of the embodiments herein typically have electronic components and the nanowire photodiode. In the front-side nanowire structure, the upstanding nanowire is on the same side of the substrate where the electronic components are located, while in the back-side nanowire structure, the upstanding nanowire is located on the side of the substrate opposite to the side where the electronic components are located in or on the substrate.

The CMOS pixel and nanowire can be formed by using different materials, respectively. For example, silicon, could be used to fabricate a CMOS image device. The nanowire, however could be formed on the fabricated CMOS device by using group III-V or group II-VI materials, e.g., GaAS, GaN, GaP, InP, InN, InAs, CdTe, CdSe, ZnS, ZnSe, etc.

A transfer gate is a switch or a transistor used in a pixel. The transfer gate's role is to transfer the charges from one side of a device to another. In some embodiments, the transfer gate is used to transfer the charges from the photodiode to the sense node (or floating diffusion). A reset gate is a gate switch used for resetting a device. In some embodiments, the device is the sense node which is formed by an n+ region. Reset means to restore to original voltage level set by a certain voltage. In some embodiments, the voltage of the reset drain (RD) is the voltage used as a reset level.

A pinned photodiode is a photodiode that includes a state that does not have a voltage variation. A conventional pinned photodiode includes a doped pinning layer at the surface of the active layer of the photodiode which depletes the mobile charges in the photodiode. The pinning layer typically pins the potential of the surface of the active layer of the photodiode to the potential of the substrate, typically ground level or zero volts. In this manner, the pinning layer reduces dark current from the surface of the active layer of the photodiode.

In some embodiments, silicon NWs (SiNW) are be grown using the vapor-liquid-solid (VLS) growth method. In this method, a metal droplet catalyzes the decomposition of a Si-containing source gas. Silicon atoms from the gas dissolves into the droplet forming a eutectic liquid. The eutectic liquid functions as a Si reservoir. As more silicon atoms enter into solution, the eutectic liquid becomes supersaturated in silicon, eventually causing the precipitation of Si atoms. Typically, the Si precipitates out of the bottom of the drop, resulting in bottom up growth of a Si-NW with the metal catalyst drop on top.

In some embodiments, gold is used as the metal catalyst for the growth of silicon NWs. Other metals, however, may be used, including, but not limited to, Al, GA, In, Pt, Pd, Cu, Ni, Ag, and combinations thereof. Solid gold may be deposited and patterned on silicon wafers using conventional CMOS technologies, such as sputtering, chemical vapor deposition (CVD), plasma enhanced chemical vapor deposition (PECVD), evaporation, etc. Patterning may be performed, for example, with optical lithography, electron-beam lithography, or any other suitable technique. The silicon wafer can then be heated, causing the gold to form droplets on the silicon wafer. Silicon and gold form a eutectic at 19% Au having a melting temperature at 363° C. That is, a liquid drop of Si—Au eutectic forms at 363° C., a moderate temperature suitable for the processing of silicon devices.

In some embodiments, the substrates have a (111) orientation. Other orientations, however, may also be used, including, but not limited to (100). A common silicon source gas for NW production is $SiH_4$. Other gases, however, may be used including, but not limited to, $SiCl_4$. In some embodiments, NW growth may be conducted, for example, with $SiH_4$ at pressures of 80-400 mTorr and temperatures in the range of 450-600° C. In some embodiments, the temperature is in a range of 470-540° C. Typically, lower partial pressures of $SiH_4$ result in the production of a higher percentage of vertical nanowires (NW). For example, at 80 mTorr partial pressure and 470° C., up to 60% of the SiNWs grow in the vertical <111> direction. In some embodiments, NWs may be grown which are essentially round. In other embodiments, the NW are hexagonal.

In one embodiment, NW growth is conducted in a hot wall low pressure CVD reactor. After cleaning the Si substrates with acetone and isopropanol the samples may be dipped in a buffered HF solution to remove any native oxide. Successive thin Ga and Au metal layers (nominally 1-4 nm thick) may deposited on the substrates by thermal evaporation. Typically, the Ga layer is deposited before the Au layer. In an embodiment, after evacuating the CVD-chamber down to approximately $10^{-7}$ torr, the substrates can be heated up in vacuum to 600° C. to form metal droplets. The Si-NWs can be grown, for example, at a total pressure of 3 mbar using a 100 sccm flow of SiH4 (2% in a He mixture) in a temperature range from 500° C. to 700° C.

The size and length of the Si-NWs grown with a Au—Ga catalyst are relatively homogeneous, with most of the wires oriented along the four <111> directions. For comparison, Si-NWs grown with a pure Au catalyst nucleate and grow with lengths and diameters of the NWs more randomly distributed. Further, NWs grown with a Au—Ga catalyst tend to have a taper along the axial direction. The tip diameters of NWs grown for a long time are the same as those grown for a short time and are determined by the catalyst diameter. The footprints of the NWs, however, tend to increase during the course of the growth. This indicates that NW tapering is caused primarily by sidewall deposition (radial growth) of silicon. NWs may be grown having a diameter at the foot (base) of 1500 nm, while the diameter of the tip may less than 70 nm over a length of 15 µm. Further, the NW diameter is a function of growth temperature. Higher growth temperatures result in NW with smaller diameters. For example, the average diameter of NWs grown with the Ga/Au catalyst at 600° C. is about 60 nm but the average diameter decreases down to about 30 nm for growth at 500° C. Additionally, the variation in diameters tends to narrow as deposition temperature is lowered.

Using the VLS process, vertical NWs may be grown. That is, nanowires which are essentially perpendicular to the substrate surface. Typically, not all NW will be perfectly vertical. That is, the NWs may be tilted at an angle to the surface other than 90 degrees. Commonly observed tilted NWs include, but are not limited to, the three 70.5°-inclined <111> epitaxial growth directions and three additional 70.5°-inclined directions, which are rotated by 60°.

In addition to growing vertical NWs, the VLS process may be used to grow doped NWs. Indeed, by changing the composition of the source gases, a doping profile in the growing wire can be produced. For example, the NW can be made p-type by adding diborane ($B_2H_2$) or trimethyl borane (TMB) to the source gas. Other gases that add acceptor atoms to the silicon NW may also be used. The NW can be made n-type by adding $PH_3$ or $AsH_3$ to the source gas. Other gases that add donor atoms to the silicon NW may also be used. Doping profiles which can be produced, include but are not limited to, n-p-n, p-n-p, and p-i-n.

Additionally, other methods or variations of the VLS method may be used to grow NWs. Other methods or variation include, but are not limited to, (1) CVD, (2) reactive atmosphere, (3) Evaporation, (4) molecular beam epitaxy (MBE), (5) laser ablation, and (6) solution methods. In the CVD process, a volatile gaseous silicon precursor is provided. Example silicon precursor gases include $SiH_4$ and $SiCl_4$. CVD may be used for epitaxial growth. Further, doping can be accomplished by adding volatile doping precursors to the silicon precursor. Annealing in a reactive atmosphere comprises heating the substrate in a gas that reacts with the substrate. For example, if silicon is annealed in an atmosphere including hydrogen, the hydrogen locally reacts with the silicon substrate, forming $SiH_4$. The $SiH_4$ can then react with the catalyst metal drop, thereby initiating NW growth. This growth process can be used for non-CMOS processes.

In the evaporation method, a $SiO_2$ source is heated under conditions that result in the production of SiO gas. When the SiO gas adsorbs on the metal catalyst droplets, it forms Si and $SiO_2$. This method may also be performed without a metal catalyst drop. Absent a metal catalyst, $SiO_2$ has been observed to catalyze silicon NW growth. In the MBE method, a high purity silicon source is heated until Si atoms evaporate. A gaseous beam of Si directed toward the substrate. The gaseous silicon atoms adsorb onto and dissolve into the metal droplet, thereby initiating growth of NWs.

In the laser ablation method, a laser beam is aimed at source which includes both silicon and catalyst atoms. The ablated atoms cool by colliding with inert gas molecules and condense to form droplets with the same composition as the original target. That is, droplets having both silicon and catalyst atoms. The laser ablation method may also be performed with a target consisting essentially of pure silicon. Solution based techniques typically use organic fluids. Specifically, the organic fluids generally comprise highly pressurized supercritical organic fluids enriched with a silicon source and catalyst particles. At a reaction temperature above the metal-silicon eutectic, the silicon precursor decomposes, forming an alloy with the metal. Upon supersaturation, silicon precipitates out, growing the NW.

The above nanowire growth techniques are all bottom up techniques. Nanowires, however may also be fabricated with top down techniques. Top down techniques typically involve patterning and etching a suitable substrate, for example silicon. Patterning can be accomplished via lithography, for, example, electron beam lithography, nanosphere lithography and nanoprint lithography. Etching may be performed either dry or wet. Dry etching techniques include, but are not limited to, reactive ion etching. Wet etching may be performed with either standard etches or via the metal-assisted etching process. In the metal-assisted etching process, Si is wet-chemically etched, with the Si dissolution reaction being catalyzed by the presence of a noble metal that is added as a salt to the etching solution.

A nanowire absorbs a certain selective bandwidth of light energy depending on its dimensions and its design parameters such as a diameter, length and refractive index of its core and cladding layers. Unabsorbed light energy travels along the nanowire as in a waveguide. By using these characteristics, the nanowire could be used as a color selective filter device in an imaging device. Further, the nanowire structured photodetector could be constructed as a color sensitive photo sensor. By extending this feature, a color information gathering pixel array could be formed.

FIG. 2A shows a simplified cross section view of one pixel of a focal plane array of many such cells formed in an imaging device. Each pixel includes a readout circuit 100 formed on a semiconductor substrate 101 with metal lines 103 above the substrate. As a photosensitive element, a nanowire structured photodetector 102 is formed standing up from the substrate. Photo absorption takes place along the length of the nanowire structured photodetector 102. The output of the nanowire structured photodetector 102 can be connected to the readout circuit 100 located in the substrate. Since the footprint of the nanowire structured photodetector 102 is small, more than one nanowire structured photodetector 102 can be formed in a pixel. The role of the long vertical structure of the nanowire structured photodetector 102 is to absorb a certain bandwidth of light energy and generate a corresponding electrical signal and/or to guide the unabsorbed light energy to the substrate diode with minimum loss, thus performing as a waveguide. At the top end of the nanowire, an optical coupler (e.g., a lens) 105 could be formed to couple the incident light into the nanowire with minimum energy loss or reflections. In this embodiment, a micro lens may be used as a coupler. The microlens may be, but not limited to, a spherical ball lens. The coupling efficiency of a spherical ball lens is typically higher than 90%. In another aspect, a binary microlens may be used as shown in FIG. 2B.

FIG. 3 shows a simplified cross section view of a pixel which has a nanowire structured photodetector at the back side of a thinned semiconductor substrate. The nanowire 109 generates photo charges by absorbing light energy in a certain bandwidth and dumping the charges into the thinned substrate. The charges are then collected by readout circuits 100 in the thinned substrate using an electrical field. Also, the nanowire guides and couples unabsorbed light into the substrate 108. An advantage of employing a nanowire structured photodetector at the back side of the substrate 108 is the ease of fabricating the nanowires. When forming nanowires at the front side, it is necessary to remove the thick dielectric layers 104 illustrated in FIG. 2A in a region where the nanowire is supposed to be constructed. In contrast, the embodiment disclosed in FIG. 3 could be made without this removal step. Further, the nanowire may be fabricated without modifying front side structure of the CMOS devices. This embodiment includes both front side metal and insulating layers 106 and backside metal and insulating layers 107. Further, as in the front side embodiment, a micro lens of an optical coupler 105 may be coupled to the nanowire 109.

A nanowire structured semiconductor could be configured in a variety of photodetector configurations. These configurations include: a photo conductor, a photodiode, or a photogate device. A photo conductor is a photo sensitive device whose resistivity varies as a function of incident light. A photodiode is a p-n diode or a p-i-n diode which generates electron-hole pairs as a photo charge. A photogate device is a MOS (metal-oxide-semiconductor) device with a biased gate that creates a potential well in the semiconductor and accumulates photo charge in the potential well. In the following embodiments, various configurations of photodiodes, photogate devices, or combinations of a photodiode and a photogate detector are implemented as photo detecting elements.

FIG. 4 shows a cross sectional view of a CMOS pixel with a nanowire structured photogate device. In this embodiment, there are two photodetectors per pixel, a nanowire (NW) photogate detector and a substrate diode. The NW is formed of an n-type semiconductor with a dielectric cladding layer and a vertical gate. The role of the vertical gate surrounding the NW is to deplete the NW and create a potential well at the NW core as shown in FIG. 5B by applying a slight negative bias voltage to the NW photogate. Further increase of the negative bias voltage would invert the surface region of the NW to p+ because holes are accumulated in the surface region due to the negative photogate bias. As a result, the NW acts similarly to a pinned photodiode, however, without impurity doping. For a p-type nanowire, a positive bias voltage may be applied to deplete the nanowire. In case of a intrinsic nanowire, a photogate bias is not needed for depletion. A negative bias, however, may be applied to produce a surface pinning effect.

A vertical photogate surrounding the nanowire structured photodetector may produce several benefits. It is known that the surface of a semiconductor, including silicon, has defects due to dangling bonds of the interface atoms. These defects form defect states within the energy bandgap in a semiconductor and result in leakage or dark current through the thermal generation process. Without the photogate bias, the NW could have a very large dark current generated from its surface region. This is because the surface to volume ratio of the NW is very large compared to a conventional substrate device. Thus, a photogate bias voltage may help suppress the dark current by electrically passivating the nanowire surface. The surface of the nanowire may also be passivated by chemically treating the surface to remove all dangling bonds. Such a method, can be implemented for a silicon nanowire, for example, by the use of atomic layer deposition (ALD) of a very thin layer of material such as LaAlO, $GdScO_3$, $LaScO_3$, etc. Alternatively, the surface may be chemically treated with $HfO_2$ through the use of MOCVD or sputtering.

Another problem could be caused by the NW surface is that photo generated carriers could have a short lifetime due to the recombination process occurring at the defect states at NW surface. Passivating the NW surface by applying the bias voltage to the surrounding photogate is therefore beneficial because it helps reduce the dark current and enhances the photo carrier lifetime, resulting in better quantum efficiency.

The electrical potential of the NW core is not constant along the axial direction C1-C2 of the NW. This is because the top end of the NW is open and influenced most by the negative gate bias while the bottom end of the NW is connected to the N-well that has positive bias voltage during reset and holds the bias after reset. As a result, the closer to the top of the nanowire, the more negative the bias. The closer to the bottom of the NW, the more positive bias established in the NW. As a result, a potential gradient is established along the axial direction of the NW as shown in FIG. 6. This gradient causes photo charges generated in the NW to drift into the potential well in the substrate diode.

In another aspect, a p-type NW is used. In this aspect, a positive bias voltage can be applied to the photogate that surrounds the NW as shown in FIG. 5C. In this case, the surface of the p-type NW becomes depleted with a slight positive photogate bias. Further increase of the photogate bias would deplete the entire region of the NW, i.e., from the surface to the core of the NW. A potential profile for this aspect of the NW is shown in FIG. 5D.

In the substrate, a p-n junction diode may be formed between the p-type substrate and n-well region. A p+ layer covers the n-well surface except the NW junction. This p+ shape allows receiving the photo charges coming from the NW and suppress the dark current due to the surface states of the substrate. Since light passing through the NW can illuminate the substrate diode, photo charges are generated in the substrate diode and collected in the potential well. Consequently, the potential well collects the charges both from the NW and the substrate diode. Compared to conventional CMOS pixels which utilize only a fraction of incident photons, this embodiment can enhance the quantum efficiency by utilizing most of the incident photons.

The n-well of the substrate photo diode is lightly doped so that the n-region can be easily depleted with a low bias voltage. The depleted n-well is preferred for a complete charge transfer from the substrate diode to the sense node when the transfer gate is turned on. Complete charge transfer allows for a low noise readout of the photo charges similar to CCD devices.

The sense node is formed with n+ diffusion in the substrate. The sense node is connected to an amplifying transistor, e.g., a transistor configured as a source follower transistor. A select switch transistor may be used to control the connection of the amplifier output to an output node. A reset transistor may also be connected to the sense node so that sense node is biased to VDD when the reset gate is activated. When the transfer gate is activated, the n-well is electrically connected to the sense node. Then, the n-well becomes positively biased and a potential gradient in the NW is established between the n-well potential and the vertical photogate bias voltage. For a given negative photogate bias voltage, further potential gradient along the axial direction can be obtained by gradually or stepwise varying the thickness of dielectric cladding layer as shown in FIG. 7A and FIG. 7B, respectively. Since the potential drop across the dielectric layer is proportional to the thickness of the layer, the potential of the NW varies gradually along the axial direction. This potential gradient is beneficial for efficient collection of the photo generated carriers and to enhance the carrier lifetime. This is because the axial electric field helps remove thermally generated carriers from the NW region and therefore electron-hole recombination probability is reduced.

In another aspect a p-type NW is used. For a given positive photogate bias voltage, a potential gradient along the axial NW direction can be established by gradually or stepwise varying the thickness of the cladding layer as shown in FIG. 7C and FIG. 7D, respectively.

FIG. 8 shows a cross section view of a dual photodiode structure in which the p doped NW is coated with an n+ epitaxial layer to form a p-n junction. In an alternative embodiment (now shown), the NW could be doped and the coating could be en epitaxial p+ layer to form a p-n junction.

In FIG. 8, there are two photodiodes per pixel, one is a NW diode and the other is a substrate diode. The NW photodiode is formed with a p−, n−, or intrinsic type semiconductor. A n+ layer covers the NW surface, forming a p-n diode or a p-i-n diode. In the substrate, a n− diode is lightly doped so that the n− region can be easily depleted with a low bias voltage. Photo charges are integrated in both of photodiodes at the same time, but in separate potential wells. This is because the photodiodes are separated by a p+ layer to avoid interaction between the two photodiodes. In this embodiment, there are two separated readout circuits. The readout circuit for the NW has a 3-T configuration, e.g., a rest transistor, n source follower amplifier, and a select switch (not shown in FIG. 8). The second readout circuit for the substrate diode is based on a 4-T configuration, e.g., a transfer gate, a reset transistor, a source follower transistor, and a select switch. It is also possible that the 4-T configuration be replaced with a 3-T configuration by removing the transfer gate. These two photodiodes can be used to collect charges created by radiations of different wavelengths.

Figure 9:
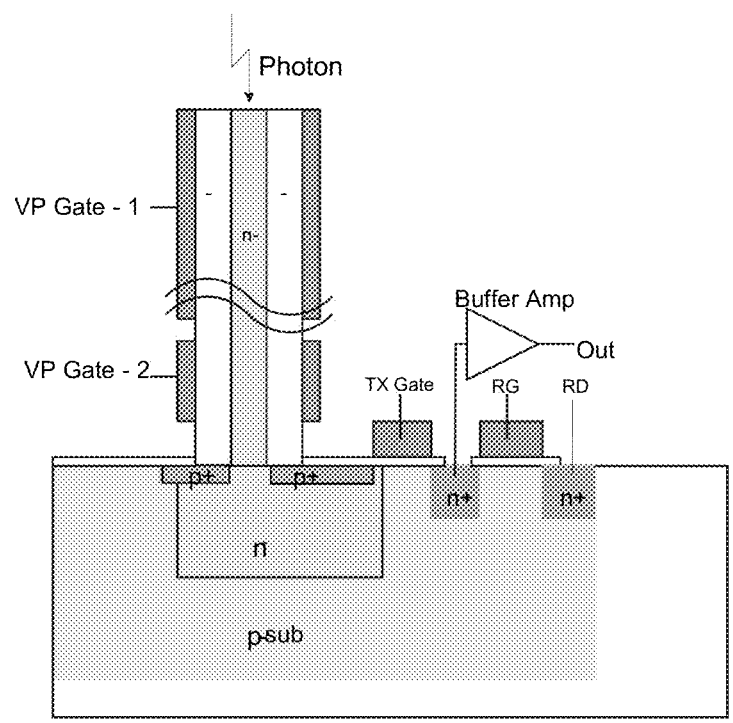
FIG. 9 illustrates an embodiment of a CMOS pixel with a nanowire structured photogate detector.

FIG. 9 shows an embodiment of a CMOS pixel with a nanowire structured photogate detector. This embodiment includes two vertical photogates (VP Gate 1, VP Gate 2) around the NW, a substrate photodiode, and a readout circuit. The readout circuit includes a transfer gate (TX), a reset gate (RG), a source follower transistor, and a pixel select switch. The buffer amplifier in FIG. 9 represents the source follower transistor and the pixel select switch for simplification. In this embodiment, an upstanding nanowire is formed with an n−, i.e. lightly doped n-type or an intrinsic semiconductor so that the NW can be easily depleted with a low negative bias voltage from VP Gate 1. Preferably, a negative bias voltage from the vertical photogate VP Gate 1 could cause accumulation of holes at the surface of the NW to suppress dark current due to the surface states of the NW as illustrated in the FIG. 5B.

The second vertical photogate VP Gate 2 could be an on/off switch. This switch could be configured to separate the photo charges generated in the NW from the photo charges integrated in the substrate photodiode. Photo charges are integrated in both the NW and substrate photodiode at the same time. The photo charges, however, are integrated in separate potential wells because the off-state of the second photogate VP Gate 2 forms a potential barrier between the NW and substrate photodiode. In this manner, signal from the NW and the substrate photodiodes do not mix together. These two photodiodes can be used to collect charges created by radiations of different wavelengths.

The vertical photogates implemented in this embodiment allow the ability to easily modify the potential profile in the NW without using a complicated ion implantation process. The conventional photogate pixel suffers from very poor quantum efficiency and poor blue response. The conventional photogate is normally made of polysilicon which covers the top surface of the substrate photodiode and absorbs short wavelengths near the blue light, thereby reducing the blue light reaching the photodiode. The vertical photogate, in contrast, does not block the light path. This is because the vertical photogate (VPG) does not lie laterally across the photodiode to control the potential profile in the semiconductor.

Additionally, as the pixel size of the image sensors scales down, the aperture size of the image sensor becomes comparable to the wavelength of light propagated. For a conventional planar type photodiode, this results in poor quantum efficiency (QE). The combination of a VPG structure with a NW sensor, however, allows for an ultra small pixel with good QE.

The NW pixel of the present embodiment uses a two step process to read out the signals separately between the NW and substrate photodiodes. In the first step, the signal charges in the substrate photodiodes are read out. Then, the n− region in the substrate is depleted. In the second step, the second photogate VP Gate 2 may be first turned on. Next, the signal charges in the NW are read out.

A device of this embodiment may be operated in a "snapshot" operation. In a "snapshot" operation, preferably all of the photogates VP gate 2 in the pixel array are turned on or off at the same time. The same could be true for the transfer gate TX. To accomplish this, the second photogate VP Gates 2 are all connected with a global connection. Further, all the transfer gates TX are connected with a second global connection.

Generally, global operation of the reset gate RG should be avoided for practical reasons. In a pixel array, it is a common practice to globally reset the array row by row. If the snapshot operation is not used, individual pixel operation is possible. In this case, it is not necessary to have global connections.

Figure 10:
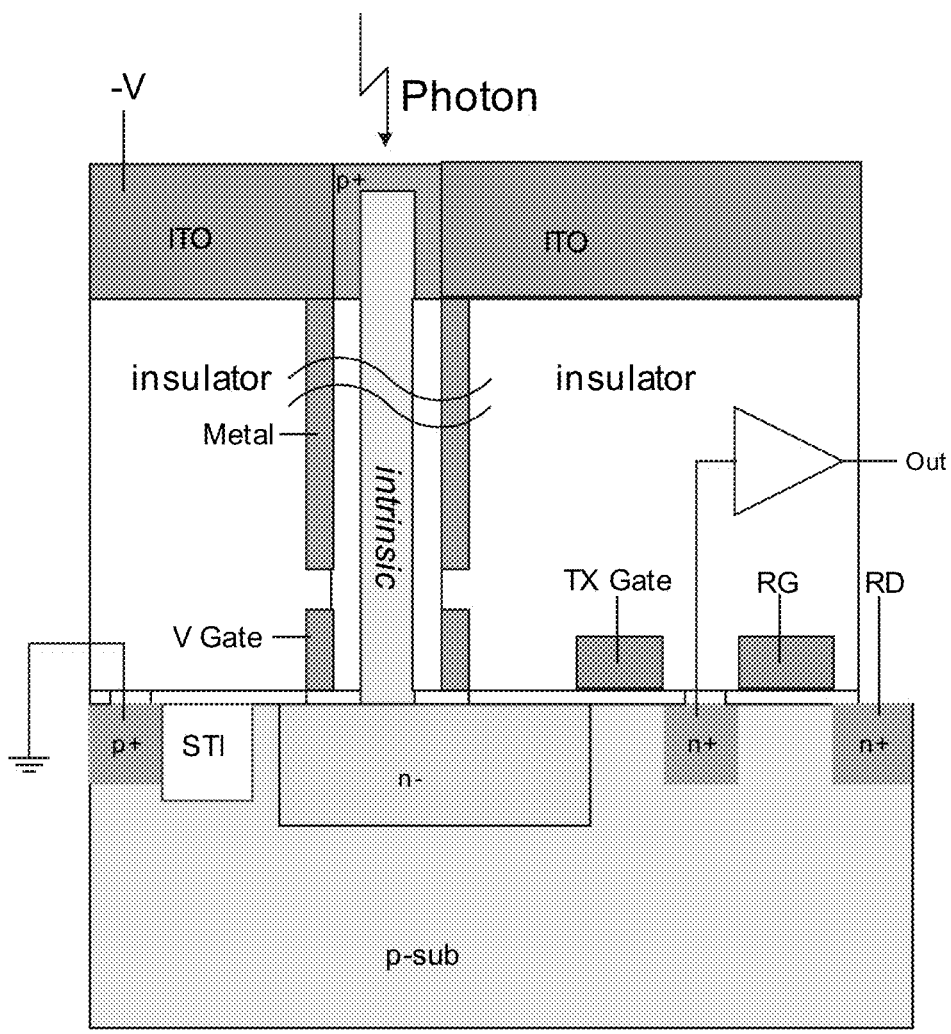
FIG. 10 illustrates an embodiment of a CMOS active pixel with nanowire structured p-i-n photodiodes and vertical photogates around the NW.
Figure 11:
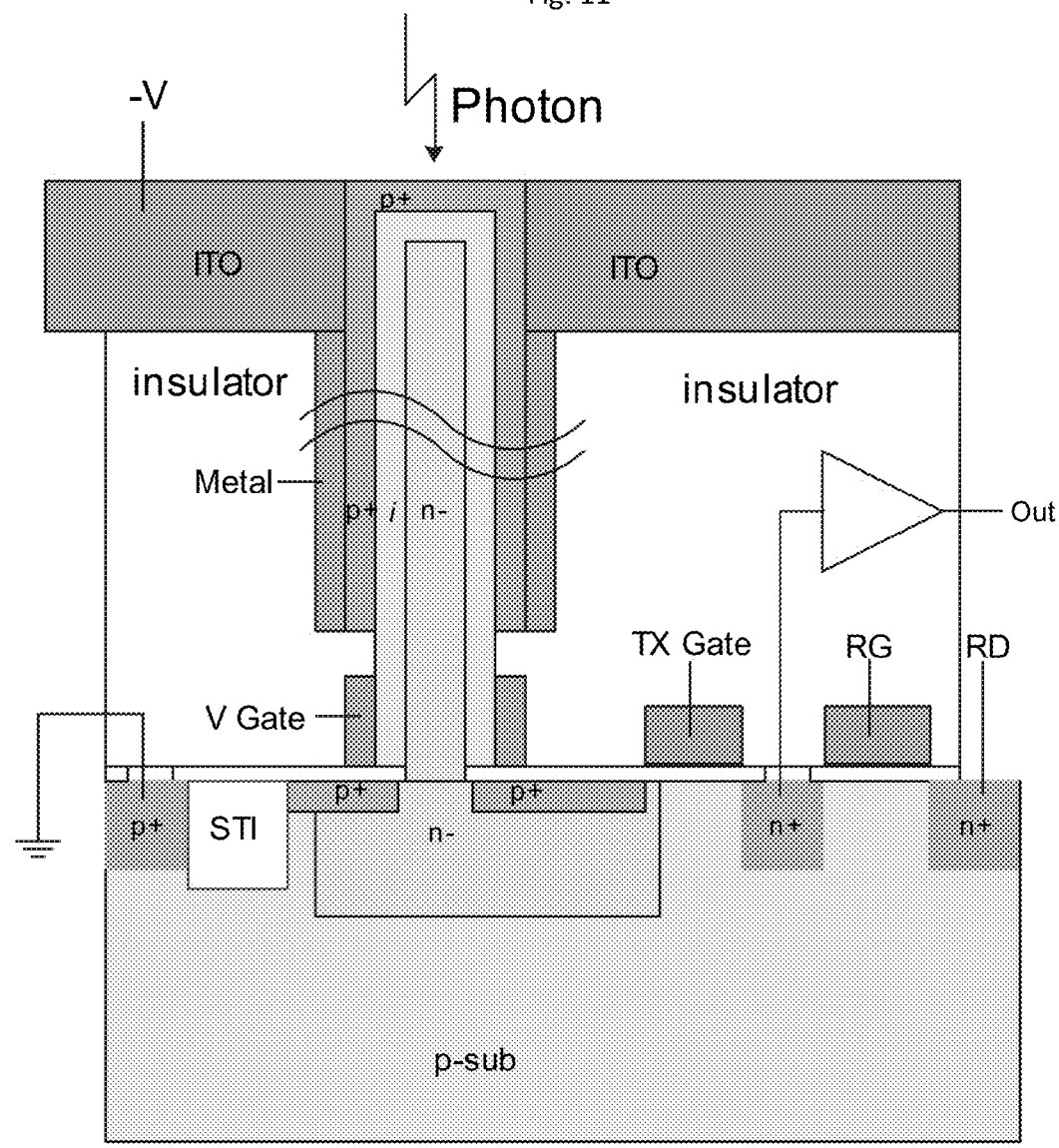
FIG. 11 illustrates another embodiment of a CMOS active pixel with nanowire structured p-i-n photodiodes and vertical photogates around the NW.

FIG. 10 and FIG. 11 show embodiments of CMOS active pixels with nanowire structured p-i-n photodiodes and vertical photogates around the NW. In one embodiment, a NW can be configured to have an axial type p-i-n photodiode by having p+ and n− at each end, respectively. In another embodiment, a NW can have a coaxial type p-i-n configuration as shown in FIG. 11. In addition to the p-i-n configurations, a NW can have one or more vertical photogates comprising epitaxially grown layers such as conductive layers and metal layers.

In one embodiment such as that shown in FIG. 10, the picxel could include two photodiodes, a NW photodiode and a substrate photodiode. This embodiment also includes two vertical photogates (VP Gate 1, VP Gate 2), a transfer gate (TX) and a reset gate (RG). Preferably, both of the photodiodes are lightly doped. This is because a lightly doped region can be easily depleted with a low bias voltage. As illustrated, both of the photodiodes are n−. Alternatively, however, the NW pixel could be configured so that both of photodiodes are p−.

The surface region of the substrate photodiode could be prone to defects due to process induced damage caused during fabrication and to lattice stress associated with the upstanding NW. These defects may serve as a source for dark current. To suppress the dark current at the surface of the n− photodiode, preferably, a shallow p+ region is fabricated on top of the n− photodiode in the substrate.

Preferably, the substrate is connected to ground, that is, zero voltage. In this embodiment, the reset drain is preferably doped n+ and is positively biased. When the transfer gate TX and reset gate are on, the n− region in the substrate becomes positively biased. This reset operation results in the n− region being depleted due to a reverse bias condition between the p substrate and n− region. When the transfer gate TX and reset gate RG are off, the n− region retains its positive bias, forming a floating capacitor with respect to the p-sub region.

The first vertical photogate VP Gate 1 could be configured to control the potential in the NW so that a potential gradient can be formed between the NW photodiode and the substrate photodiode. In this way, photo charges in the NW can drift quickly to the n− region of the substrate during readout. The second vertical photogate VP Gate 2 could be an on/off switch.

Figure 12:
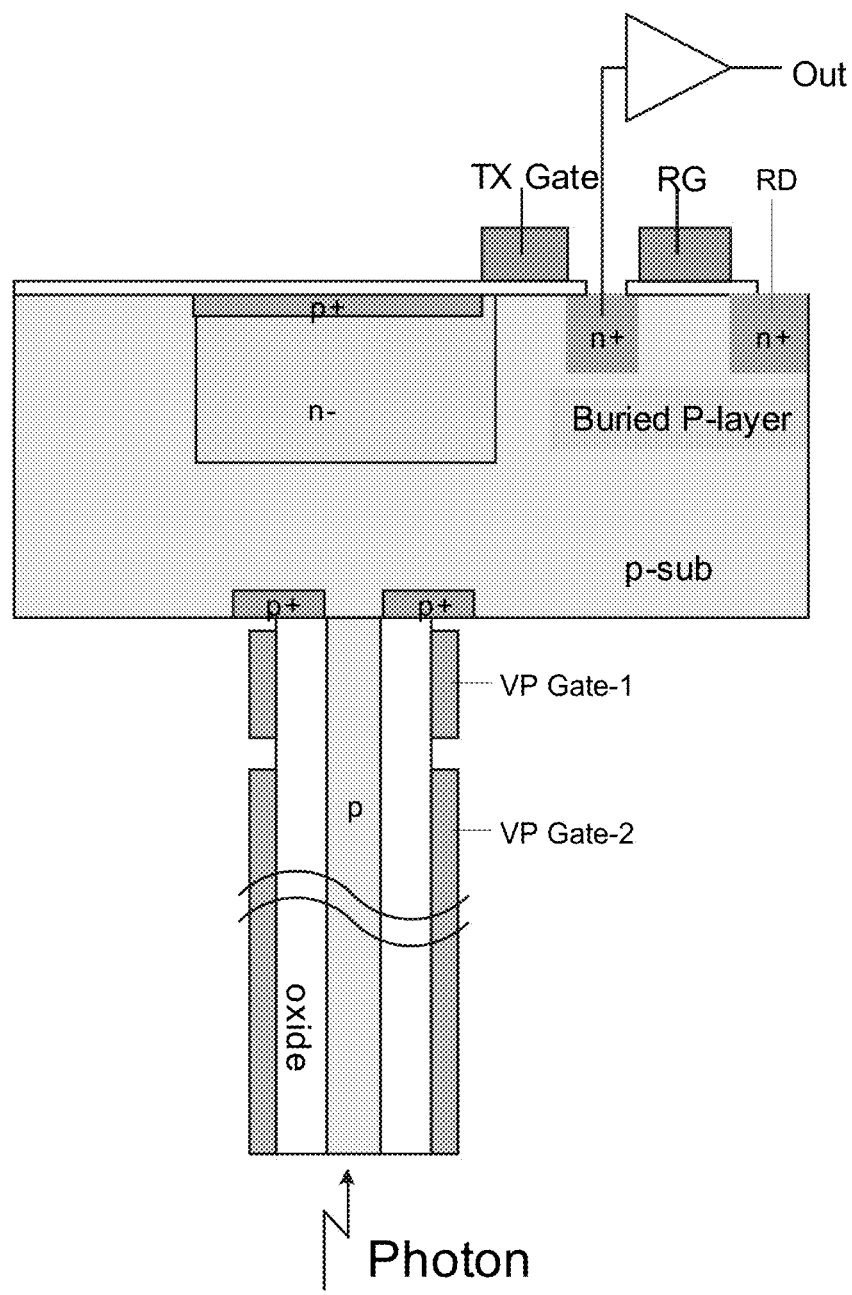
FIG. 12 illustrates an embodiments of a back-side illuminated image sensor.
Figure 13:
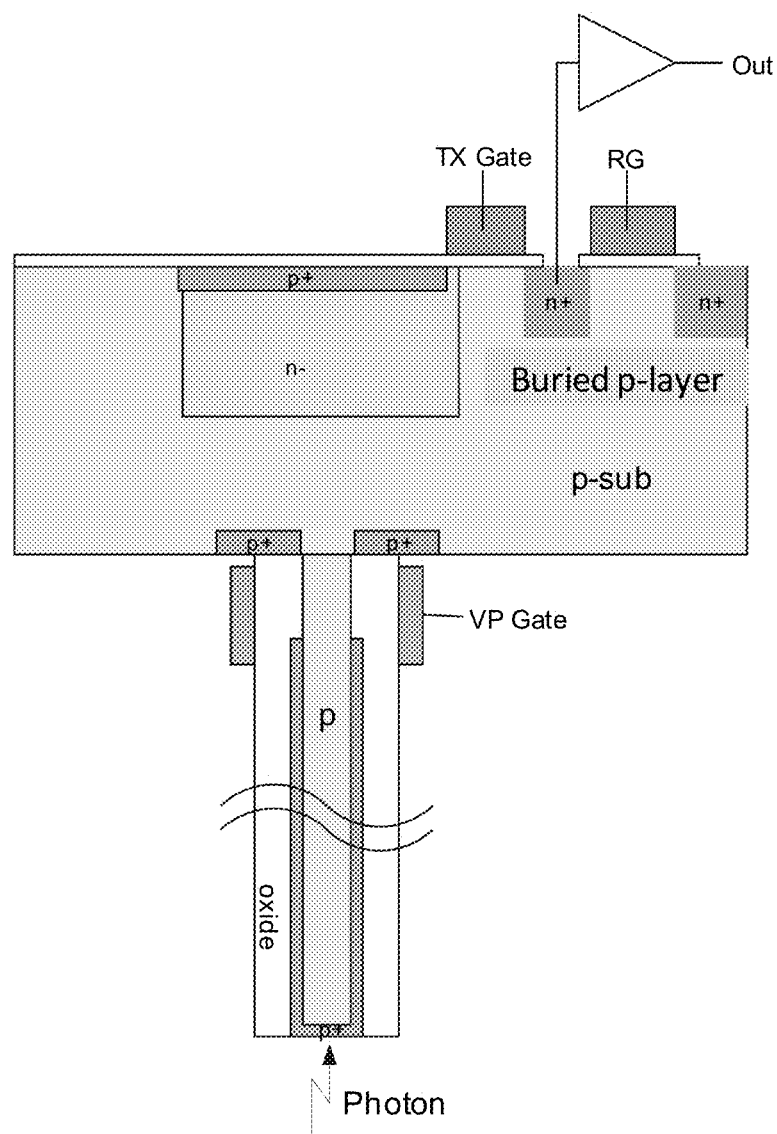
FIG. 13 illustrates an embodiments of another back-side illuminated image sensor.

FIG. 12 and FIG. 13 show embodiments of back-side illuminated image sensors. The NW could be formed at the back side of a p-substrate. The substrate may be thinned by removing semiconductor substrate material over the area containing the pixel array. For example, a p-substrate can be thinned to a thickness between 3 and 50 microns, more preferably, between 6 and 20 microns. The substrate photodiode could now get all of its light from the back-side and not from the side containing all the metal lines as in conventional image sensors.

The front side could include a 4-T readout circuit including a transfer gate TX, a reset switch with a reset gate RG, a source follower amplifier, and a select switch. The readout circuits also could be configured as a 3-T pixel circuit including, a reset switch with a reset gate RG, a source follower amplifier, and a select switch. In the front side, a substrate photodiode may be formed with a shallow p+ layer as shown in FIG. 12 and FIG. 13. The purpose of having p+ at both sides of the substrate is to suppress dark current. A buried p layer could be placed underneath the n+ diffusion layer to block incoming charge flow from the backside and deflect the charges toward the n− region. Preferably, doping of the buried p layer is higher than that of the p− substrate, but not as high as that of the p+ layer. The front side photodiode is not for photo absorption, but rather for collecting the charges coming from the NW and from the backside p-substrate where photon absorption takes place. The NW could have a dielectric layer (cladding layer) surrounding the NW and two vertical photogates, one for the switch and the other for controlling the potential in the NW.

Typically, in the embodiments of FIG. 12 and FIG. 13, a two step process is used to read out the signal charges separately from each of the photodiodes. The first step would be to read out the charges from the substrate diode at the front side. Immediately after this, by turning on the VP Gate 1, the charges from the NW would be read out.

Preferably, the embodiments of FIG. 12 and FIG. 13 should have a shallow p+ layer at the backside substrate with a hole in the center so that the p+ layer does not block the charges coming from the backside NW. Also, preferably, at the front side there should be a lightly doped n-well or n− layer underneath the shallow p+ layer so that n-well could be easily depleted.

FIG. 13 shows an alternative embodiment of a backside illuminated CMOS pixel. In this embodiment, instead of having vertical photogate for the NW, the p+ layer could be coated at the outer shell of the NW to help create a built-in electric field in the NW. With this configuration, photo charges can easily drift in the upward direction. The features of the back-side illumination CMOS pixel are similar to those of the pixel of FIG. 12.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. It is intended that the scope of the invention be defined by the claims appended hereto, and their equivalents.

What is claimed is:

1. A device comprising:
   a substrate having a front side and a back side opposite the front side;
   a nanowire photodetector located on the front side; and
   an active pixel readout circuit within the substrate in the back side.

2. The device of claim 1, wherein the nanowire photodetector comprises a photo conductor, a photodiode, or a photogate.

3. The device of claim 1, further comprising at least one vertical photogate surrounding the nanowire photodetector.

4. The device of claim 3, wherein the vertical photogate is configured to electrically passivate the surface of the nanowire, suppressing dark current.

5. The device of claim 4, wherein photo carrier lifetime is increase relative to a non-passivated nanowire photodiode.

6. The device of claim 4, wherein the device has greater quantum efficiency relative to a non-passivated nanowire photodiode.

7. The device of claim 3, wherein the nanowire comprises an n-type semiconductor.

8. The device of claim 7, wherein a negative bias applied to the nanowire causes depletion of charge carriers in the nanowire.

9. The device of claim 3, wherein the nanowire comprises a p-type semiconductor.

10. The device of claim 9, wherein a positive bias applied to the nanowire causes depletion of charge carriers in the nanowire.

11. The device of claim 1, wherein the active pixel readout circuit comprises three transistors in a 3-T configuration.

12. The device of claim 1, wherein the active pixel readout circuit comprises four transistors in a 4-T configuration.

13. The device of claim 3, further comprising a microlens coupler operatively attached to the nanowire.

14. The device of claim 13, wherein the microlens coupler is a spherical ball lens or a binary microlens.

15. The device of claim 8, wherein an increase of the negative bias above a threshold inverts the surface of the nanowire.

16. The device of claim 10, wherein increase of the negative bias above a threshold depletes the surface and the core of the nanowire of mobile charges.

17. The device of claim 3, further comprising a dielectric cladding layer between the photogate and the nanowire.

18. The device of claim 17, wherein the thickness of the dielectric cladding layer varies along the nanowire in an axial direction of the nanowire.

19. The device of claim 3, further comprises a substrate photodiode.

20. The device of claim 19, wherein the substrate photodiode is located on the back side.

21. The device of claim 19, wherein both the nanowire and the substrate photodiode are located on the same side of the substrate.

22. A device comprising:
an array of pixels, each pixel comprising a substrate having a front side and a back side opposite the front side, a nanowire photodetector located on the front side, an active pixel readout circuit within the substrate in the back side.

23. The device of claim 22, wherein the device comprises a monolithic CMOS circuit.

24. The device of claim 22, wherein the axial direction of the nanowire is substantially perpendicular to the substrate.

25. The device of claim 22, wherein the presence of two photodetectors allows the collection of electromagnetic radiations of different wavelengths.

26. A device comprising:
a substrate;
a nanowire photodetector located on the substrate, the nanowire photodetector comprising a nanowire having a surface and a core, wherein the axial direction of the nanowire is at an angle to the substrate; and
an active pixel readout circuit within the substrate; wherein the axial direction of the nanowire is substantially perpendicular to the substrate; wherein the nanowire photodetector is capable of detecting light.

27. The device of claim 26, wherein the nanowire comprises GaAs.

* * * * *